United States Patent [19]
Achiwa et al.

[11] Patent Number: 5,737,742
[45] Date of Patent: Apr. 7, 1998

[54] MEMORY SYSTEM USING FLASH MEMORY AND METHOD OF CONTROLLING THE MEMORY SYSTEM

[75] Inventors: Kyosuke Achiwa, Hino; Akira Yamamoto, Sagamihara; Hirotsugu Yamagata, Odawara, all of Japan

[73] Assignee: Hitachi, Ltd., Tokyo, Japan

[21] Appl. No.: 495,165

[22] Filed: Jun. 27, 1995

[51] Int. Cl.$^6$ .................................................. G06F 12/00
[52] U.S. Cl. .................... 711/103; 711/154; 711/158; 711/165; 364/DIG. 1; 365/185; 365/189.09; 365/218
[58] Field of Search ................................ 395/430, 481, 395/485, 492; 365/218, 189.09, 185

[56] References Cited

FOREIGN PATENT DOCUMENTS

| | | |
|---|---|---|
| 5-27924 | 2/1993 | Japan . |
| 5-241741 | 9/1993 | Japan . |

*Primary Examiner*—Frank J. Asta
*Attorney, Agent, or Firm*—Fay, Sharpe, Beall, Fagan, Minnich & McKee

[57] ABSTRACT

A memory system includes a flash memory having a plurality of individually erasable physical blocks, table section for holding the relationship in correspondence between the logical blocks allocated by the allocation section and the physical blocks first counting and managing section for counting and managing write counts of the respective logical blocks, first classifying section for classifying the logical blocks into a plurality of groups on the basis of the respective write counts of the logical blocks, erasure section for erasing data in a physical block allocated to a logical block to produce a free physical block, second counting and managing section for counting and managing the erasure counts of the respective physical blocks, second classifying section for classifying the physical blocks into a plurality of groups on the basis of the respective erasure counts of the physical blocks, control section for allocating the respective logical blocks to the physical blocks; and managing section for managing free physical blocks which are not allocated to any logical blocks, wherein the allocation control section performs an exchanging process as required which comprises the steps of allocating a logical block belonging to a logical block group having a larger write count to a free physical block belonging to a physical block group having a smaller erasure count and allocating a logical block belonging to a logical block group having a smaller write count to a free physical block belonging to a logical block group having a larger erasure count, increasing the service life of the memory system by preventing requests from collecting in a particular sector.

16 Claims, 26 Drawing Sheets

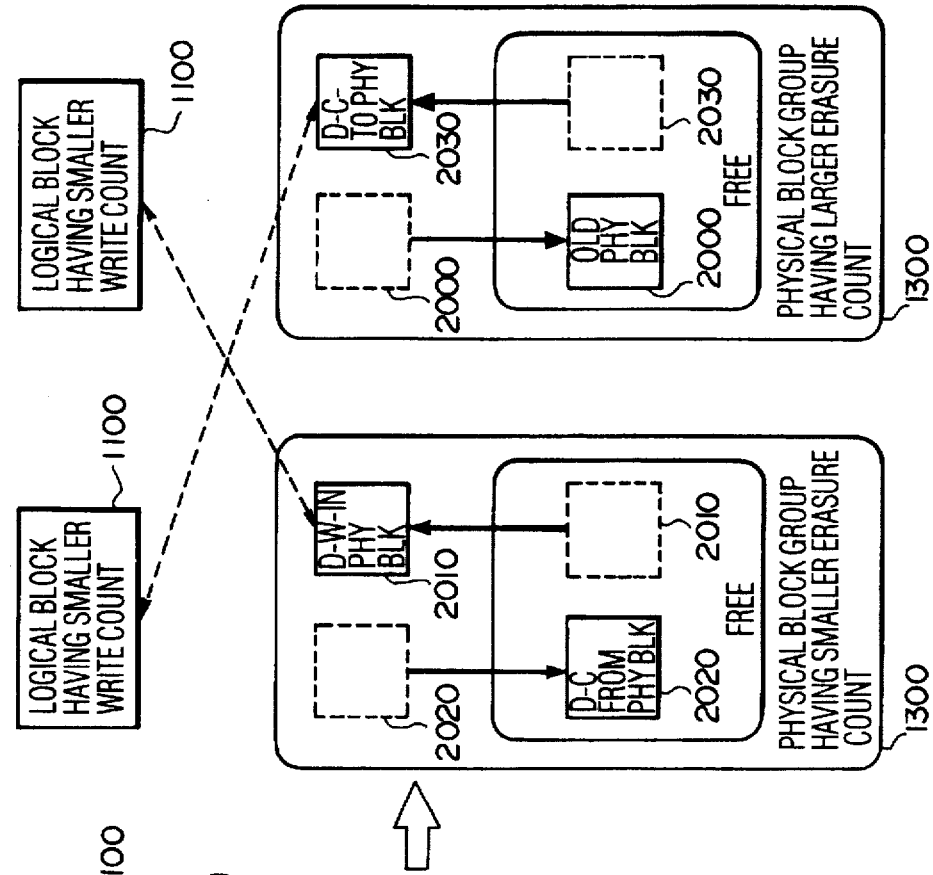
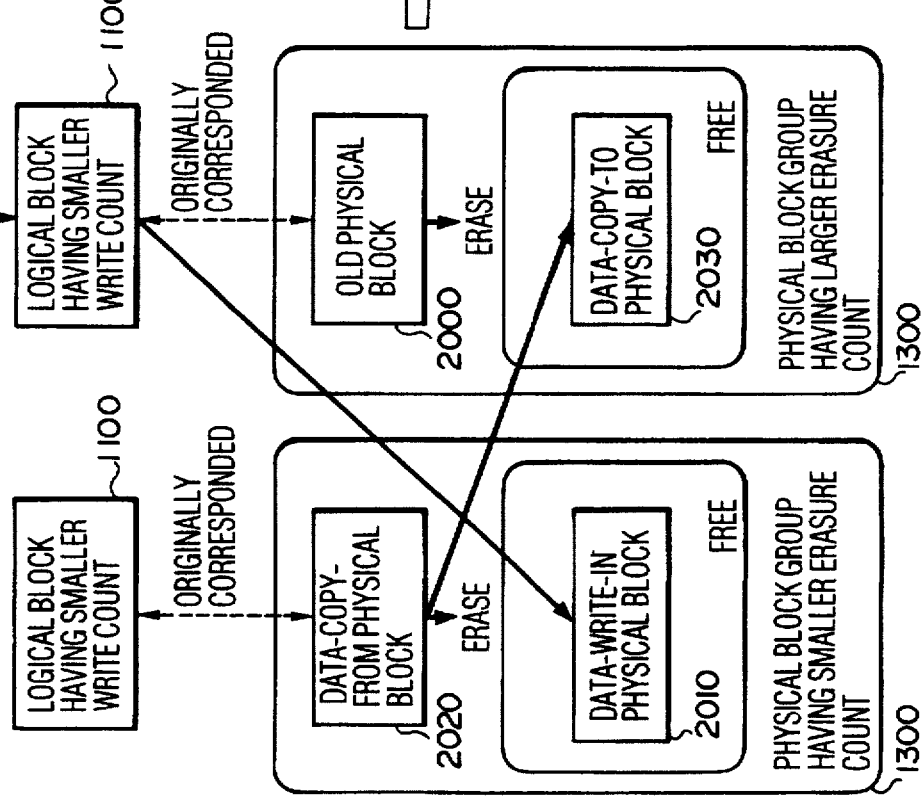

MEMORY SYSTEM USING FLASH MEMORY AND METHOD OF CONTROLLING THE MEMORY SYSTEM

BACKGROUND OF THE INVENTION

The present invention relates to memory systems using a flash memory, and more particularly to a memory system which attaches importance to its service life and response performance.

Flash memories are non-volatile like read only memories (ROMs) and also semiconductor memories from and into which data is readable and writable, respectively, like random access memories (RAMs).

The flash memories have the following limitations in use which the static RAMs (SRAMs) and dynamic RAMs (DRAMs) do not have:

(1) The unit of erasure is not a bit or byte, but a sector or chip;
(2) There is a limitation in the erasure count; and
(3) Erasure and write processes take a few milliseconds.

Unexamined published Japanese Patent Application JP-A-5-27924 discloses the following method to solve the limitations (2) and (3) of the flash memory:

In an embodiment of the present invention to be described later, the use of a flash memory in which data is erasable in units of a sector is assumed. Thus, only that portion of the prior art involved in the erasure of data in units of a sector will be described next.

First, addressing is made by mapping logical addresses designated by a host computer and physical addresses in a semiconductor memory.

When an erasure command is input before a write command, data in the sector concerned is nullified and its erasure starts in the background.

When a write command is input, it is written into a sector in which data is to be written, selected previously in consideration of its erasure count from among all free sectors.

Unexamined published Japanese patent application JP-A-5-241741 discloses a method of controlling the flash memory, but does not consider erasure of data in units of a sector.

Since in the prior art a sector which is not designated by an erasure command remains unerased, the erasure count varies from sector to sector, disadvantageously.

Since the situation of access is not considered, a logical address having a strong probability of being written in the future can be allocated to a sector having a larger erasure count. Thus, the erasure count varies further from sector to sector, so that the whole storage using the flash memory would have a reduced lifetime. That is, since the flash memory has an upper limit of erasure count, the lifetime of the whole memory is limited by a physical block having a larger erasure count. Thus, in order to increase the lifetime of the whole memory, the erasure counts of the respective physical blocks are required to be nearly uniform.

Since in the prior art the erasure counts of many sectors are required to be known to determine a sector in which data is to be written, which takes much time.

SUMMARY OF THE INVENTION

It is therefore a first object of the present invention to provide a memory system using a flash memory which includes a plurality of physical blocks of one-several sectors erasable in units of a sector and nearly uniform in erasure count to thereby prolong the lifetime of the memory system.

A second object of the present invention is to provide a memory system using a flash memory capable of determining a physical block to be allocated to a logical block in consideration of a possible access situation in the future with the memory system being erasable in units of a sector.

A third object of the present invention is to provide a memory system using a flash memory capable of retrieving at high speed a physical block in which data is to be written with the memory system being erasable in units of a sector.

In order to achieve the above objects, the present invention provides a method of controlling a memory system connected to a host device, using a flash memory wherein a logical block as a unit accessed by the host device is allocated to a physical block of the flash memory. In the method, the following steps are performed: a write count or frequency of each logical block unit is counted and managed each time data is written into that logical block. An erasure count of each physical block unit is counted and managed each time that physical block is erased. A plurality of logical blocks is classified into a plurality of logical block groups according to write count. A plurality of physical blocks is classified into a plurality of physical block groups according to erasure count. A logical block belonging to a logical block group having a larger write count is allocated to a physical block which belongs to a physical block group having a smaller erasure count when data is written into the logical block.

The present invention also provides a memory system connected to a host device (for example, a computer), using a flash memory where logical blocks each as a unit accessed by the host device are allocated to physical blocks of the flash memory, the memory system including a flash memory having a plurality of individually erasable physical blocks; table means for holding the relationship in correspondence between the logical blocks allocated by the allocation means and the physical blocks; means for counting and managing write counts of the respective logical blocks; means for classifying the logical blocks into a plurality of groups on the basis of the respective write counts of the logical blocks; erasure means for erasing data in a physical block allocated to a logical block to produce a free physical block; means for counting and managing the erasure counts of the respective physical blocks; means for classifying the physical blocks into a plurality of groups on the basis of the respective erasure counts of the physical blocks; control means for allocating the respective logical blocks to the physical blocks; and means for managing free physical blocks which are not allocated to any logical blocks. The allocation control means performs an exchanging process which comprises the steps of allocating a logical block belonging to a logical block group having a larger write count to a free physical block belonging to a physical block group having a smaller erasure count and allocating a logical block belonging to a logical block group having a smaller write count to a free physical block belonging to a logical block group having a larger erasure count.

According to the present invention, if a logical block having a larger write count (or frequency) corresponds to a physical block having a larger erasure count, and if a logical block having a smaller write count corresponds to a physical block having a smaller erasure count, possible uneven erasure counts among the respective physical blocks are suppressed by changing an allocating or mapping relationship such that a physical block having a smaller erasure count is allocated to a logical block having a larger write count and that a physical block having a larger erasure count is allocated to a logical block having a smaller write count.

As a result, erasure counts of the respective physical blocks are nearly equalized, so that the lifetime of the whole storage system using a flash memory is increased.

By using a group table which designates a queue of physical blocks belonging to a respective one of at least one logical block group corresponding to each physical block group for this group, required information is acquired rapidly when a physical block is exchanged (in an exchange write process in the embodiment to be described later). Thus, the physical block to be allocated is retrieved rapidly.

BRIEF DESCRIPTION OF THE DRAWINGS

FIGS. 10A and 10B illustrate the concept of an exchange write process;

DESCRIPTION OF THE PREFERRED EMBODIMENT

A preferred embodiment of the present invention will be described in more detail next with reference to the accompanying drawings.

Figure 1:
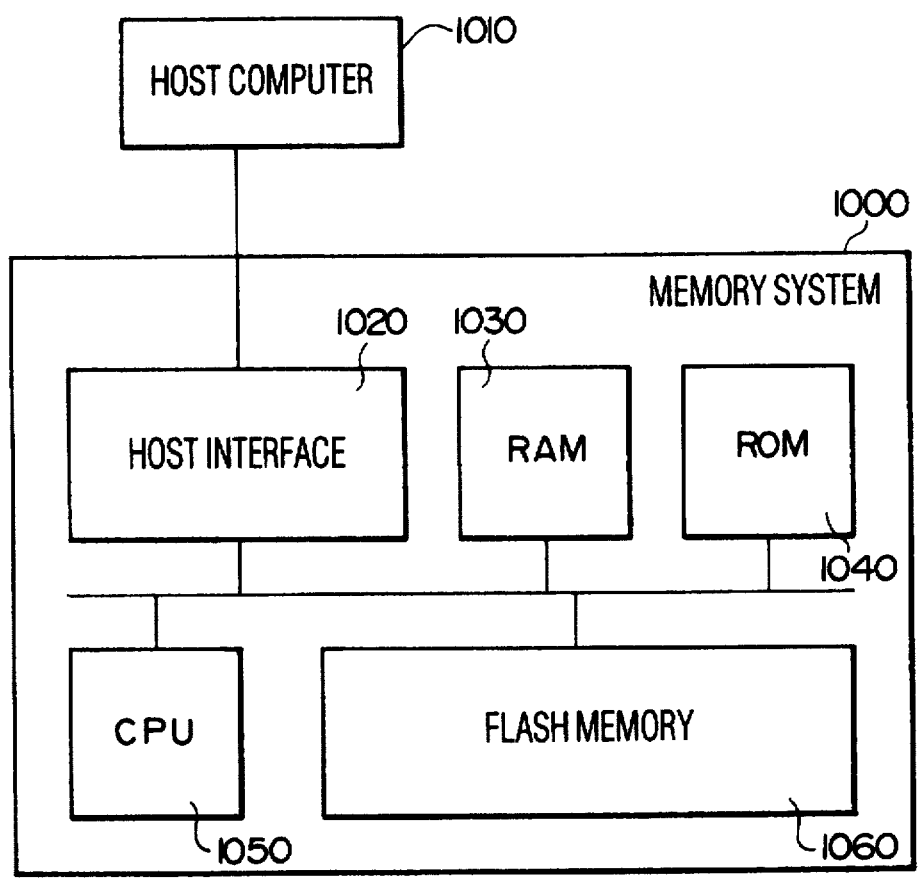
FIG. 1 is a block diagram indicative of an illustrative construction of a memory system using a flash memory as a first embodiment of the present invention.

FIG. 1 shows the structure of a memory system 1000 as a first embodiment of the present invention. The memory system 1000 is connected to a host computer 1010, and includes a host interface 1020 which transmits/receives data to/from the host computer 1010, central processing unit (CPU) 1050, ROM 1040 which contains a control program of the present invention, RAM 1030 which holds a table necessary for control and functions as a buffer for data, and a flash memory 1060 which stores data.

Figure 2:
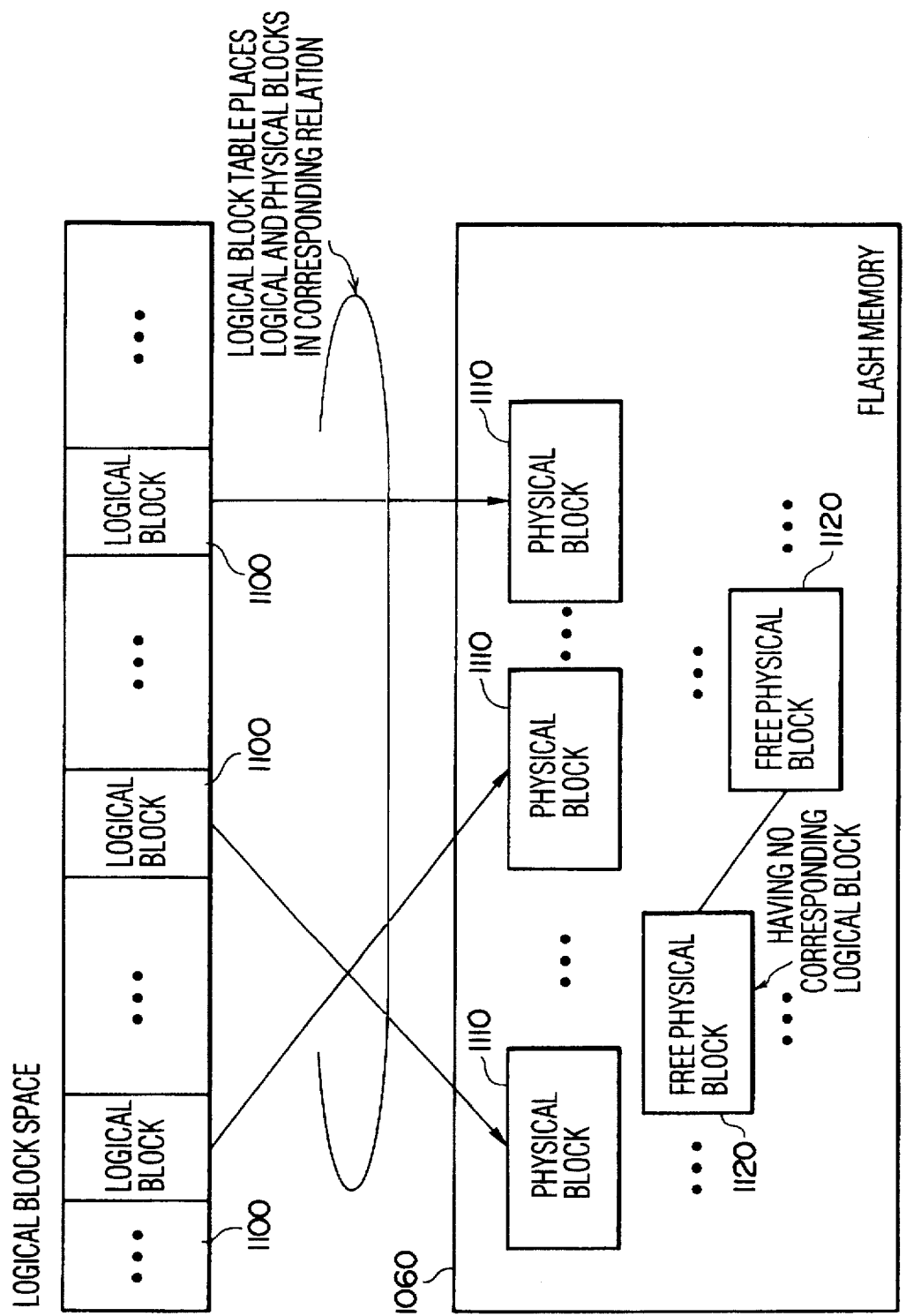
FIG. 2 illustrates the relationship in correspondence between logical and physical spaces.

FIG. 2 shows the relationship in correspondence between a logical block space accessed from the host computer 1010 and a physical block space of an actual flash memory 1060 in the memory system 1000. The physical block space is composed of normal physical blocks 1110 corresponding to logical blocks 1100 in one-to-one relationship, and free physical blocks 1120 which have no corresponding logical blocks 1100. The logical blocks 1100 and the physical blocks 1110 are placed in a corresponding relationship by a logical block table 1400 which will be described in more detail later with all the logical blocks 1100 having corresponding physical blocks 1110. All the physical blocks 1110 are classified according to erasure count, and compose a physical block group in dependence on the range of an erasure count. Each physical block is composed of one to several sectors.

Figure 3:
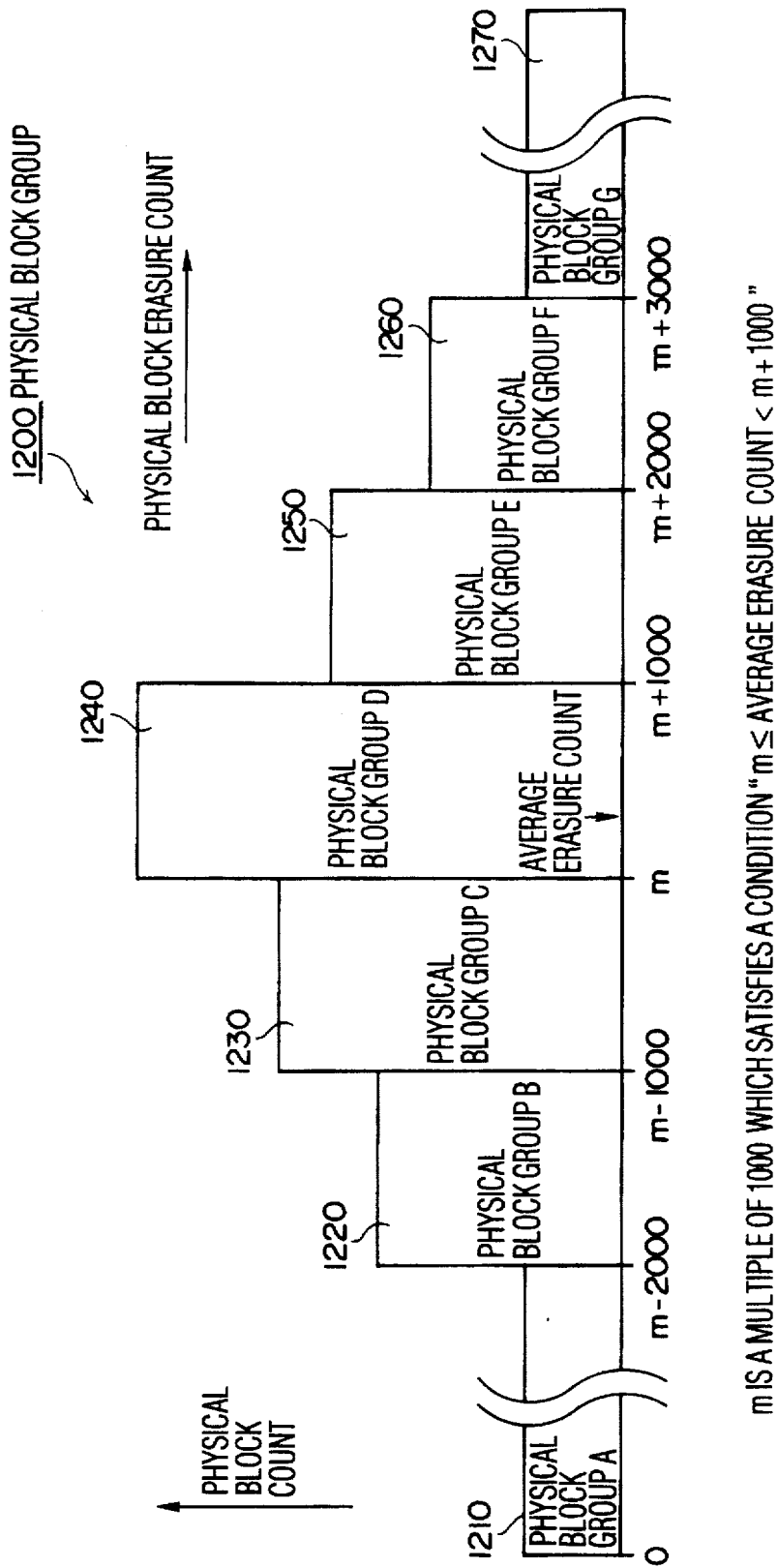
FIG. 3 illustrates the concept of a physical block group.

FIG. 3 shows the concept of a physical block group 1200 (physical blocks 1210–1270). The axis of abscissas shows an erasure count of a physical block 1100 while the axis of ordinates shows the number of physical blocks 1110 belonging to each group. The physical blocks 1110 are grouped according to reference erasure count "m" which is a multiple of 1,000 and which satisfies a condition "m≦average erasure count<m+1,000" (in FIG. 3, m which satisfies the above condition is 3,000) into a physical block group A1210 of physical blocks 1110 having erasure counts of 0 to m−2,001, physical block group B1220 of physical blocks 1110 having erasure counts of m−2,000 to m−1,001, physical block group C1230 of physical blocks 1110 having erasure counts of m−1,000 to m−1, physical block group D1240 of physical blocks 1110 having erasure counts of m to m+999, physical block group E1250 of physical blocks 1110 having erasure counts of m+1,000 to m+1,999, physical block group F1260 of physical blocks 1110 having erasure counts of m+2,000 to m+2,999, and physical block group G1270 of physical blocks 1110 having erasure counts of m+3,000 or more. The average erasure count is included in the physical block group D1240 in dependence on the definition of m.

In the present embodiment, assume that the limit of the erasure count of the flash memory 1060 is, for example, a million. At this time, the erasure counts of the physical block 1110 can take a value of 0–999,999. Each of divisions of this range of erasure count by 1000 is referred to as an erasure count group 1280. The physical block groups B1220–F1260 have corresponding consecutive erasure count groups 1280. One free physical block 1120 is prepared for each erasure count group 1280.

While in the present embodiment the respective ranges of erasure count of the physical block groups B1220–F1260 and the erasure count group 1280 are assumed to be equally 1,000, the present invention is applicable even when this value is changed. The number of physical block groups 1200 is not necessarily limited to 7 (A–G). Two or more free physical blocks 1120 may be allocated to each erasure count group 1280. In this case, if there is a request for writing data having a size of two or more blocks from the host computer 1010, data for the total capacity of a plurality of free prepared physical blocks 1120 can be written consecutively into those free prepared blocks even when other physical blocks are not erased.

Like the physical blocks 1110, the logical blocks 1100 are classified according to write count into logical block groups.

Figure 4:
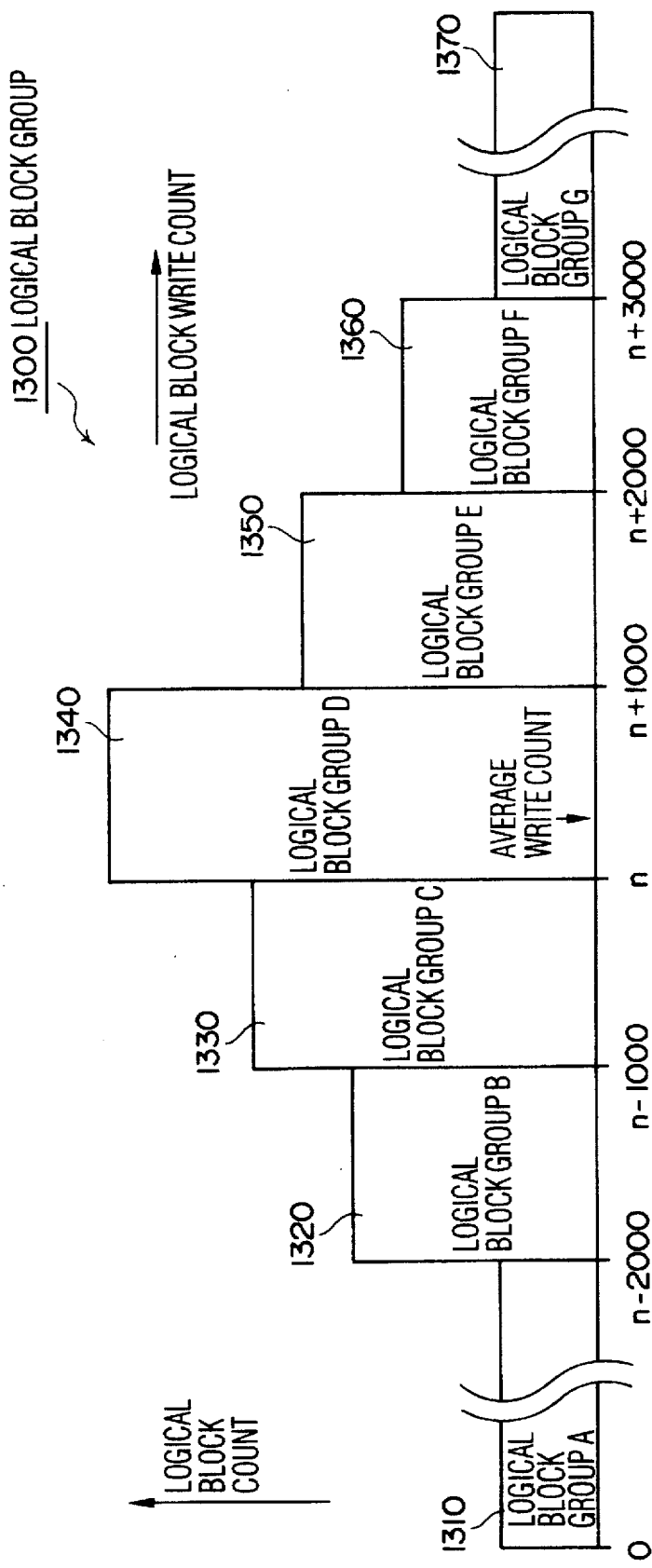
FIG. 4 illustrates the concept of a logical block group.

FIG. 4 shows the concept of a logical block group 1300 (logical blocks 1310–1370). The axis of abscissas shows a write count of a logical block 1100 while the axis of ordinates shows the number of logical blocks 1100 belonging to each group. The logical blocks 1100 are grouped according to reference write count "n" which is a multiple of 1,000 and which satisfies a condition "n≦average write count<n+1,000" (in FIG. 4, n which satisfies the above condition is 3,000) into a logical block group A1310 of logical blocks 1100 having write counts of 0 to n−2,001, logical block group B1320 of logical blocks 1100 having write counts of n−2,000 to n−1,001, logical block group C1330 of logical blocks 1100 having write counts of n−1,000 to n−1, logical block group D1340 of logical blocks 1100 having write counts of n to n+999, logical block group E1350 of logical blocks 1100 having write counts of n+1,000 to n+1,999, logical block group F1360 of logical blocks 1100 having write counts of n+2,000 to n+2,999, and logical block group G1370 of logical blocks 1100 having write counts of n+3,000 or more. The average write count is included in the logical block group D1340 in dependence on the definition of n.

While in the present embodiment the respective ranges of write count of the logical block groups B1320–F1260 are equally handled as 1000, this value may be changed in order to apply the present invention. In addition, the number of groups may be changed to apply the present invention.

Figure 5:
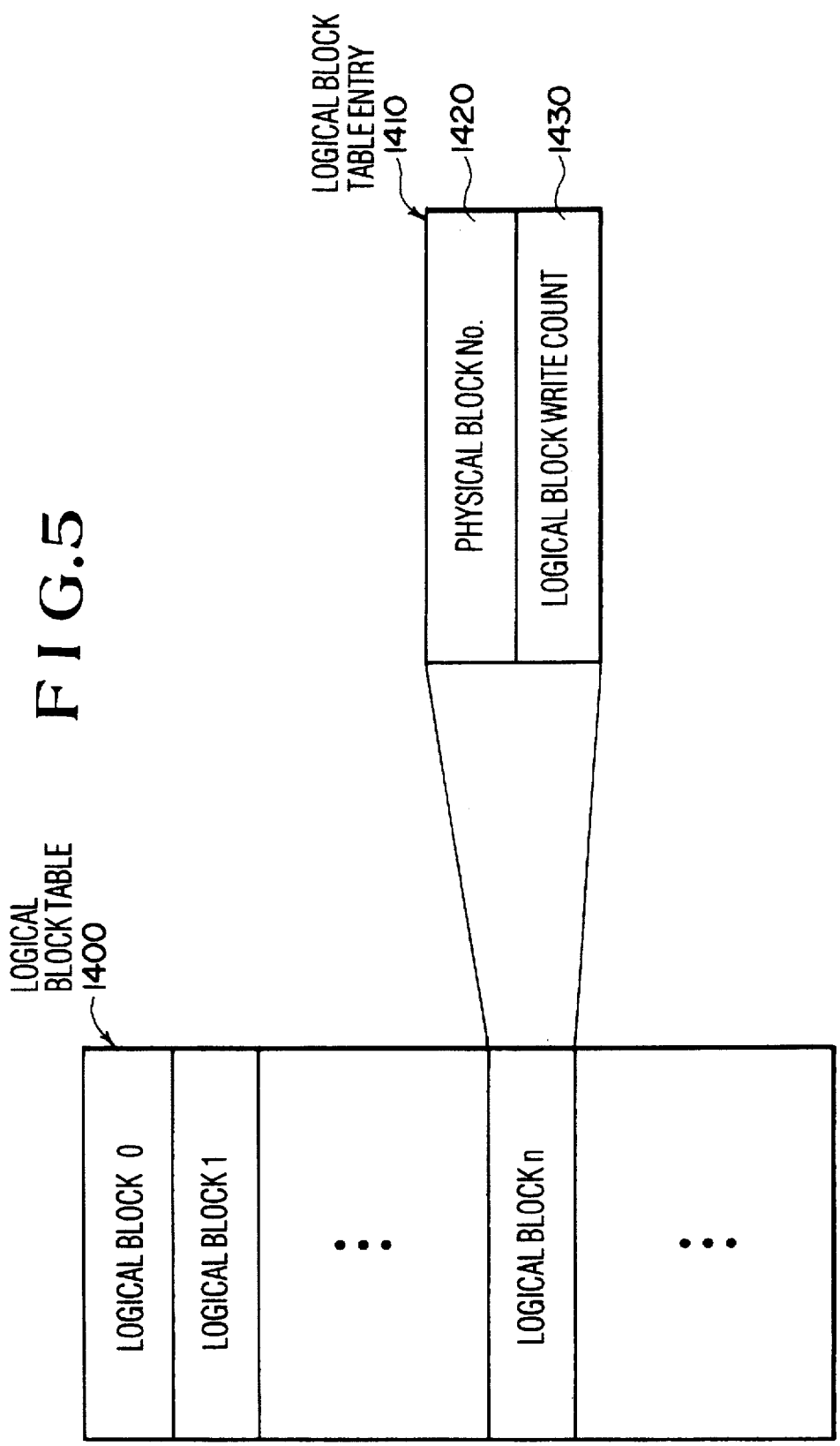
FIG. 5 illustrates a logical block table and its entry, corresponding to a first embodiment.

FIG. 5 shows a logical block table 1400 which places the logical blocks 1100 and physical blocks 1110 in a corresponding relationship. The logical block table 1400 has an entry for each logical block 1100. Each logical block table entry 1410 stores data on a corresponding physical block number 1420 and a write count into a logical block corresponding to the physical block.

Figure 6:
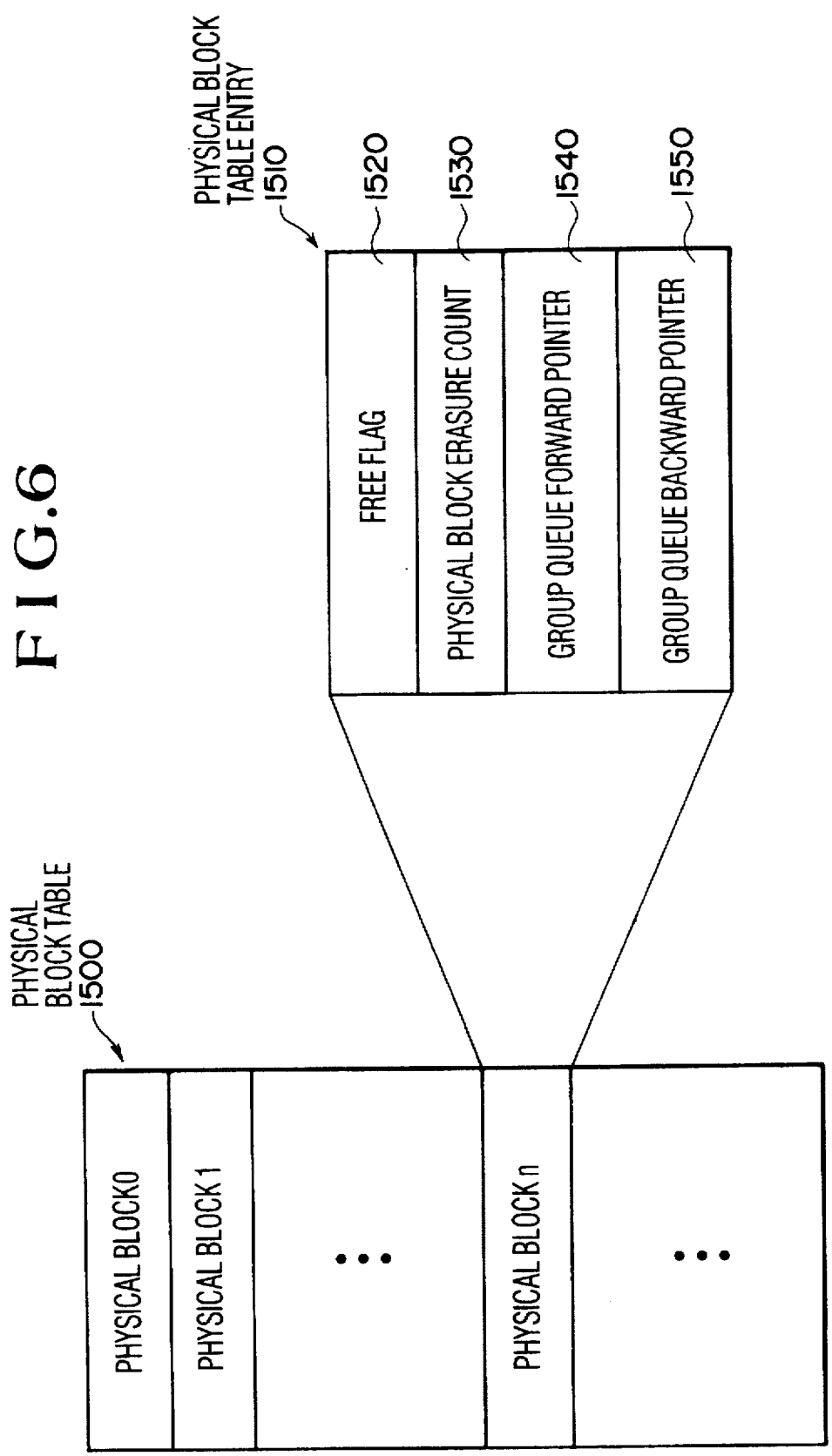
FIG. 6 illustrates a physical block table and its entry.

FIG. 6 shows a physical block table 1500, which has a physical block table entry 1510 for each physical block 1110. The physical block table entry 1510 has a free flag 1520 indicative of whether a physical block concerned is free, an erasure count 1530 of that physical block, a forward pointer 1540 and a backward pointer 1550 which are the entity of a group queue 1800 to be described later in more detail. For convenience of simplification in the present embodiment, the forward and backward pointers 1540 and 1550 store not the value (address) of the pointer to the physical block 1110, but the physical block number. Of course, it may store the value of the pointer to the physical block 1110.

The physical blocks 1110 corresponding to the logical blocks 1100 are classified into the physical block groups 1200, as described above, and managed as queues classified for the respective logical block groups 1300 of the logical blocks 1100 corresponding to the physical blocks 1110. Those queues are referred to as group queues 1800. Free physical blocks 1120 are prepared one for each of the erasure count groups 1280 and managed by the free physical block table 1600.

Figure 7:
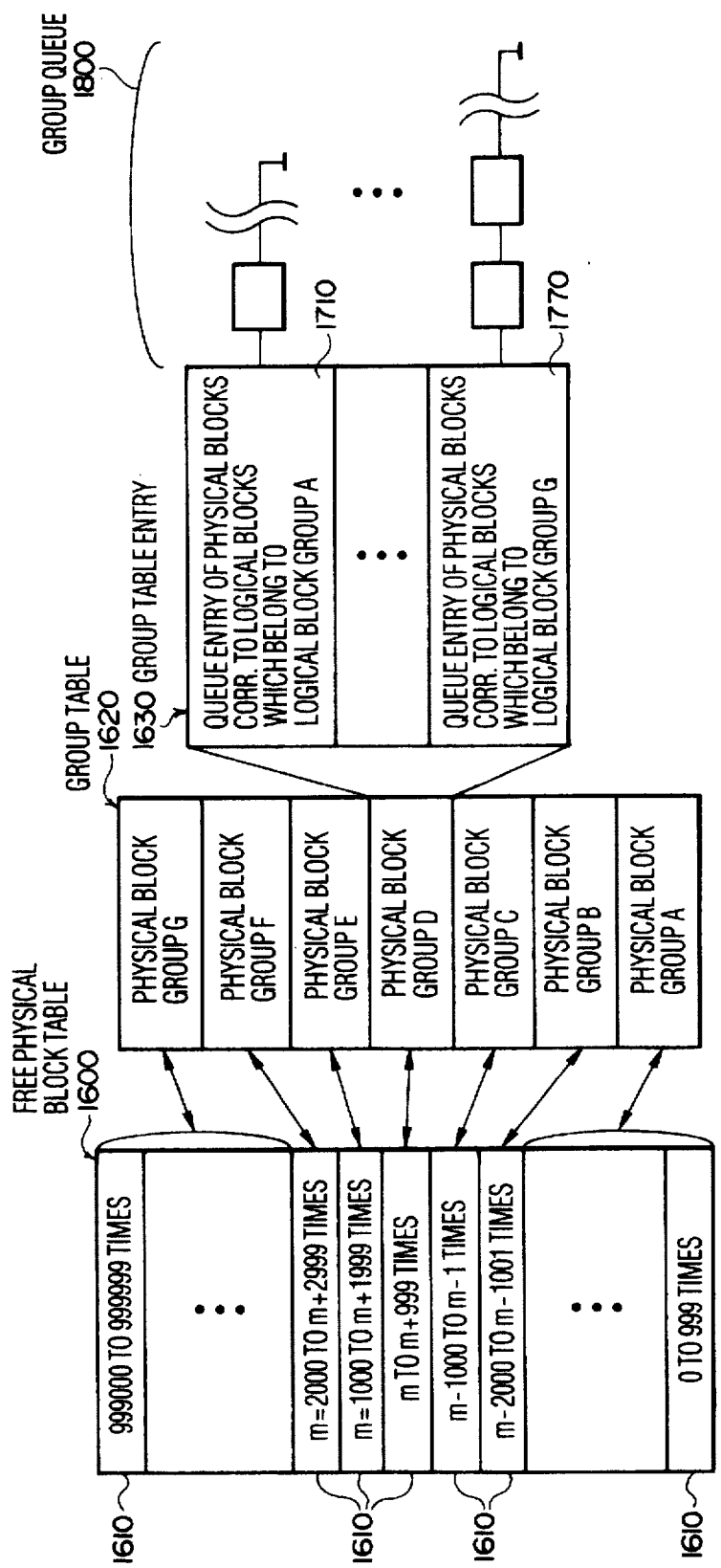
FIG. 7 illustrates a free physical block table, group table, its entry and group queue.

FIG. 7 shows a free physical block table 1600, group queues 1800 and a group table 1620 which manages the group queues 1800. By provision of the group table 1620, a physical block from which data is to be copied, which is hereinafter abbreviated as a "data-copy-from physical block" (and a physical block in which data is to be written, which is hereinafter abbreviated as a "data-write-in physical block"), especially in the exchange write processes, is retrieved rapidly, as will be described later.

The free physical block table 1600 has entries 1610 for the number of erasure count groups 1280 with each entry 1610 storing physical block numbers of the free physical blocks 1120 belonging to the erasure count group 1280. (As described above, in the present embodiment, all the erasure count groups 1280 each have at least one free physical block at all times. The entries 1610 of the free physical block table 1600 corresponding to physical block groups A and G are allocated many free physical blocks which do not belong to the other physical groups.) The entity of the group queue 1800 includes a forward pointer 1540 and a backward pointer 1550 stored in the physical block table 1500 and composing a bilateral connection list. The group table 1620 has an entry for each of the physical block groups 1200. Each entry has a queue entry 1710 of the physical blocks 1110 corresponding to the logical blocks 1100 belonging to the logical block group A1310, a queue entry 1720 of the physical blocks 1110 corresponding to the logical blocks 1100 belonging to the logical block group B1320, a queue entry 1730 of the physical blocks 1110 corresponding to the logical blocks 1100 belonging to the logical block group C1330, a queue entry 1740 of the physical blocks 1110 corresponding to the logical blocks 1100 belonging to the logical block group D1340, a queue entry 1750 of the physical blocks 1110 corresponding to the logical blocks 1100 belonging to the logical block group E1350, a queue entry 1760 of the physical blocks 1110 corresponding to the logical blocks 1100 belonging to the logical block group F1360, and a queue entry 1770 of the physical blocks 1110 corresponding to the logical blocks 1100 belonging to the logical block group G1370. The respective queue entries 1710–1770 store the corresponding physical block numbers of the head positions of the queues. The backward pointers 1550 of the end ones of the respective group queues 1800 store corresponding particular values indicative of the end queues. (For convenience of representation in the drawings, reference numerals 1720–1760 are not shown.)

Figure 26:
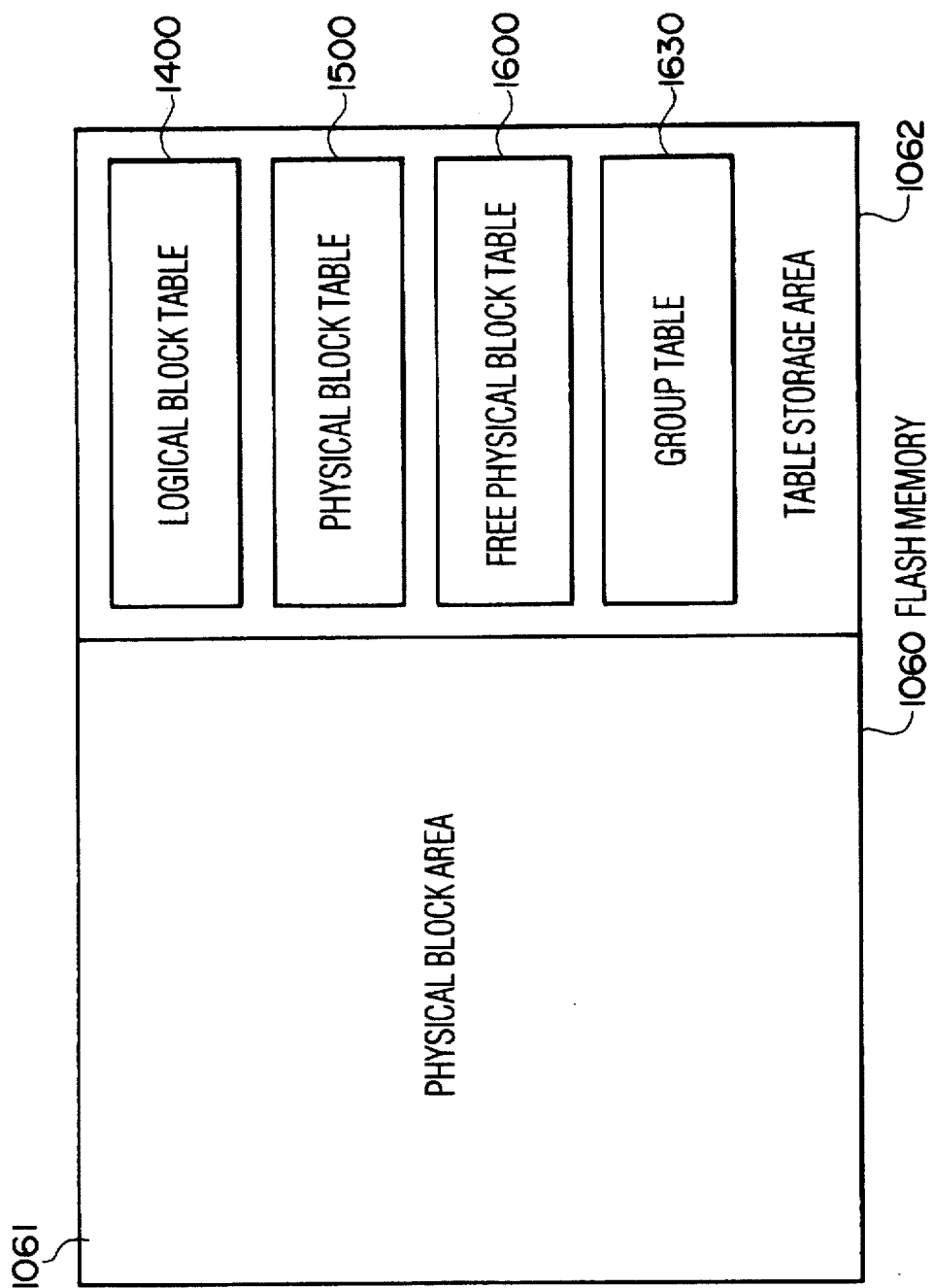
FIG. 26 illustrates a table stored in a flash memory.

While the table is stored in the RAM 1030 when the memory system 1000 is used, those data in the RAM 1030 are erased when the power supply is turned off. Thus, as shown in FIG. 26, when the memory system is turned off, the data in the table is stored in the table storage area 1062 of the flash memory 1060 so as not to disappear whereas when the power supply is turned on, the data in the flash memory 1060 is written into the RAM 1030.

Figure 8:
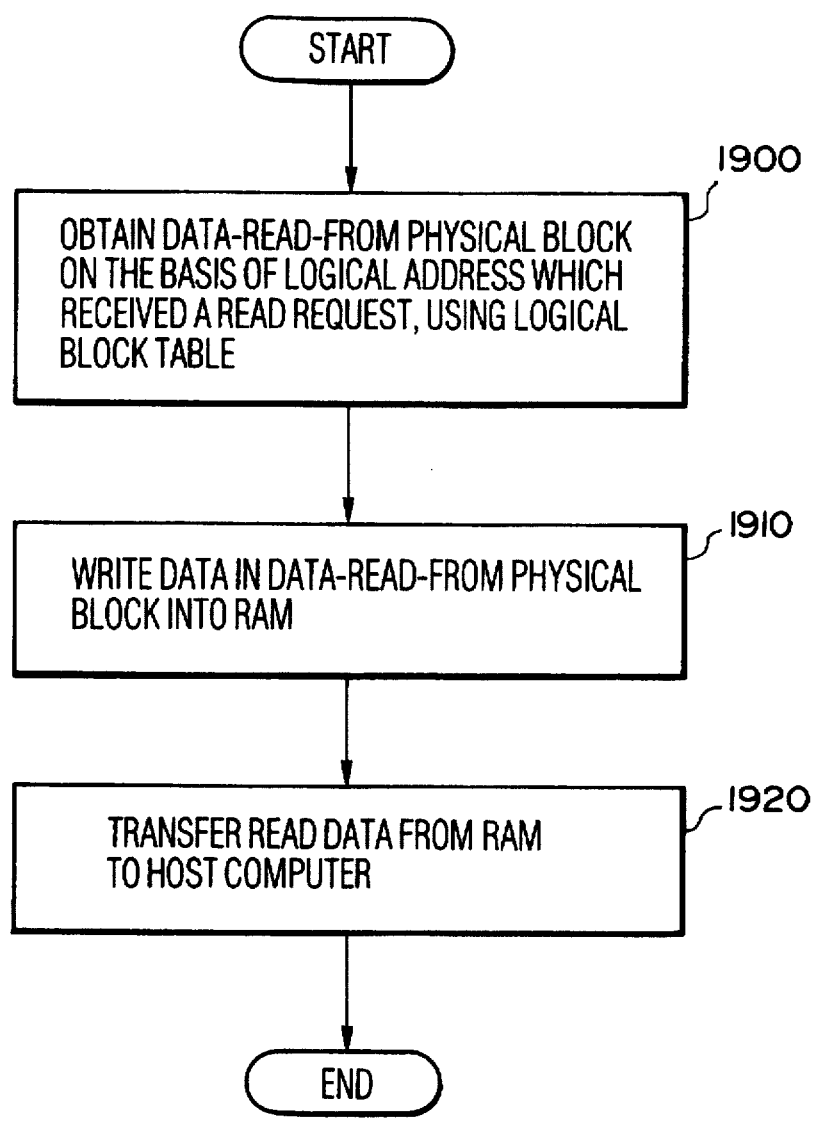
FIG. 8 is a flow chart indicative of a read process.

The read process of the memory system 1000 of the present invention will be described next with reference to FIG. 8. First, in step 1900 the CPU 1050 determines a physical block 1110 from which data is read, which is hereinafter abbreviated as a "data-read-from physical block", corresponding to a logical block 1100 which has received a read request, on the basis of an entry corresponding to the logical block table 1400. In step 1910 the CPU 1050 then writes data in that data-read physical block 1110 into the RAM 1030. Finally, in step 1920 the host interface 1020 transfers the data written into the RAM 1030 to the host computer 1010.

Since the write process is rather complicated, first, the concept of the write process will be described with reference to FIGS. 9 and 10.

Since the flash memory 1060 is limited in erasure count and takes a millisecond-order erasure time or more, disadvantageously, the inventive memory system 1000 performs a write process which is intended to conquer such drawback.

Figure 9A:
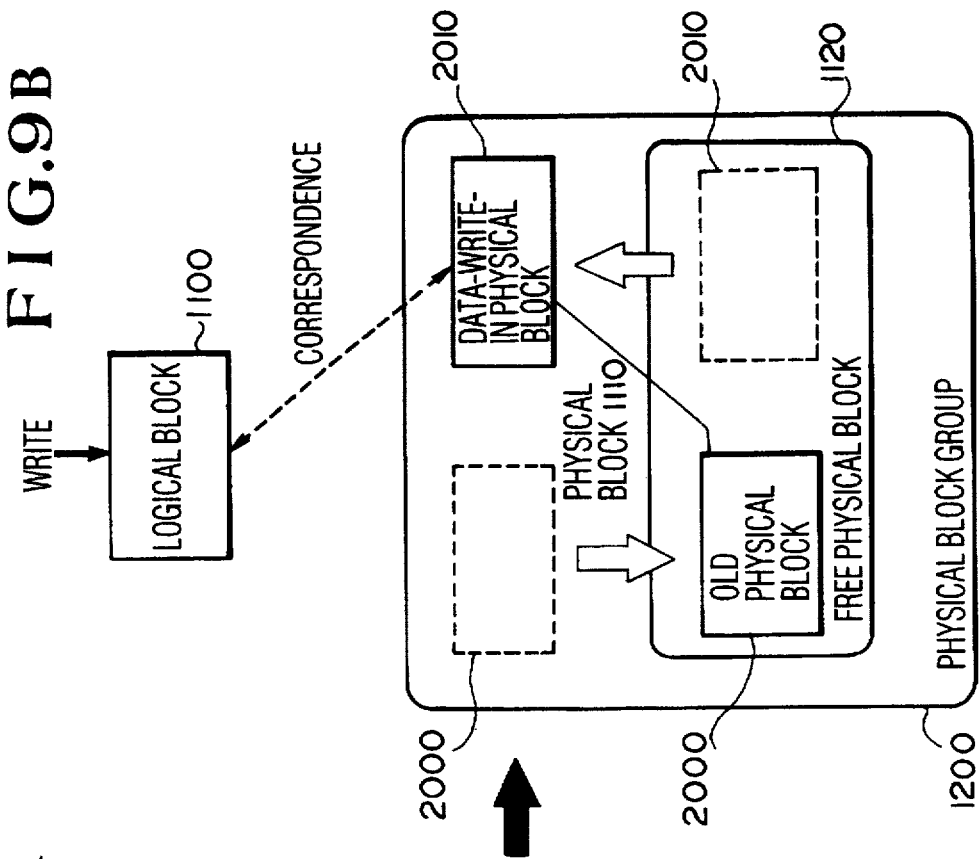
FIGS. 9A and 9B illustrate the concept of a normal write process.
Figure 9B:
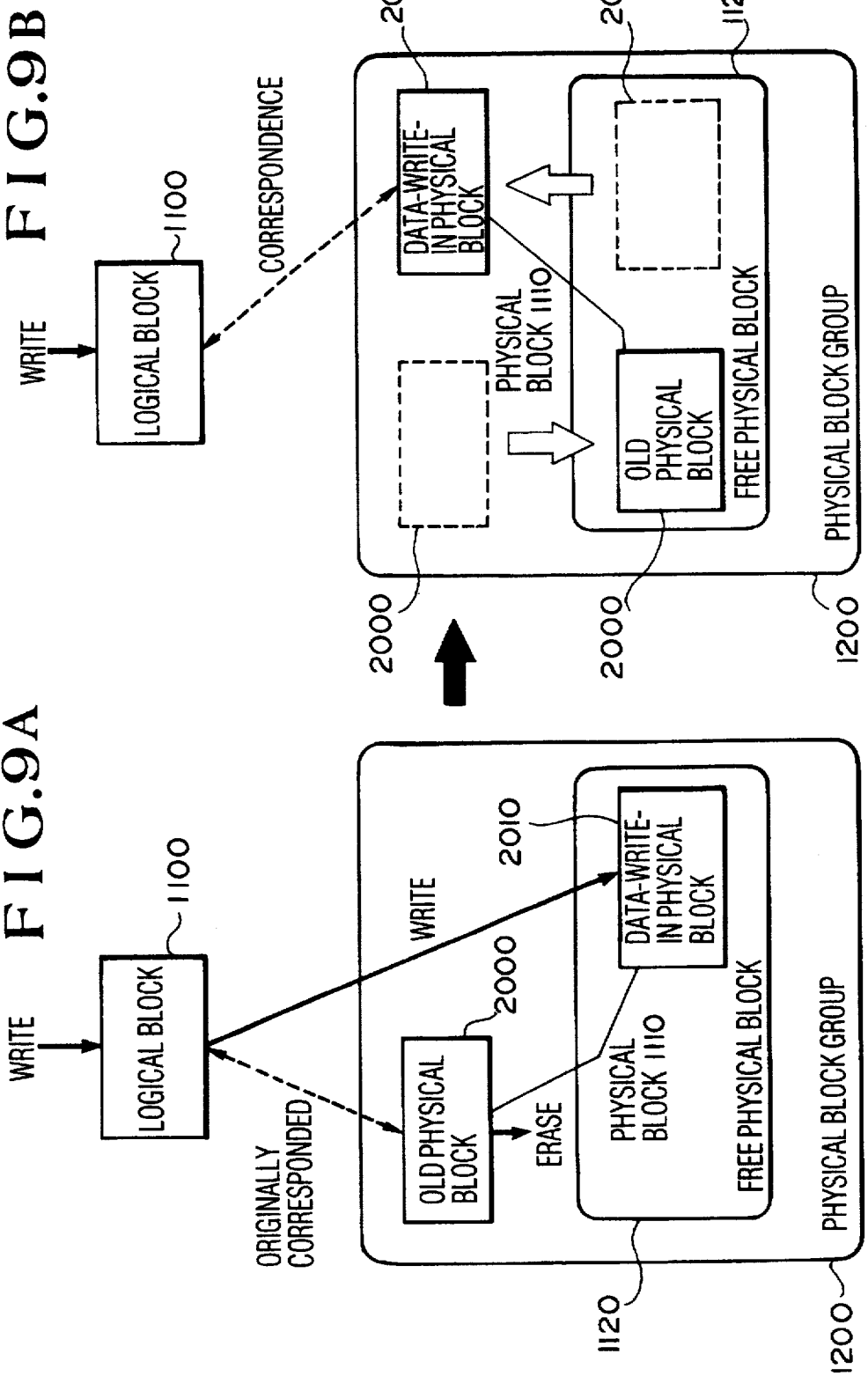

In more detail, in the write process of the present embodiment, any one of two kinds of write processes; that is, a normal and an exchange write process, is performed according to the erasure count of a literal physical block. The "normal write process" is a one performed normally, which is intended to conceal the erasure time from the host device and to maintain the balance between the write count of a corresponding logical block 1100 and the erasure count of a corresponding physical block 1110 in the same physical block group. In order to maintain the balance between the write count of the logical block 1100 and the erasure count of the physical block 1110, the process shown in FIG. 9A is performed specifically. A free physical block 2010 belonging to the same erasure count group 1280 (=the same physical block group 1200) as the physical block 1110 corresponding originally to the logical block 1100 in which data is to be written is newly allocated and data is written into the free physical block 2010 such that the erasure count of the physical block 1110 corresponding to the logical block 1100 does not change greatly before and after the write process. The advantages of such process will be described later. The newly allocated physical block 2010 is removed from the free physical block table 1600 and recorded newly into the logical block table 1400. This updates the data in the appropriate entry of the physical block table 1500. The data in the physical block (old physical block 2000) corresponding originally to the logical block is erased and recorded as a free physical block in the appropriate entry of the free physical block table 1600. The logical-physical block correspondence and the situation of the block group after completion of the normal write process are shown in FIG. 9B.

It is predicted that the logical block 1100 having a larger write count will have a relatively strong possibility of receiving a write request in the future. Thus, the "normal write process" is performed to maintain the balance between the write count of the logical block 1100 and the erasure count of the physical block 1110, so that all the physical blocks are divided gradually into physical blocks 1110 which have larger erasure counts and those which have smaller erasure counts. By the exchange write process to be described below, the erasure counts of the physical blocks 1110 are required to be rendered uniform.

When data is written into a physical block 1110 which has a larger erasure count than the averaged one (in an example to be described later, when the erasure count of the data-write-in physical block is a multiple, for example, of 1000), the "exchange write process" is performed to conceal the erasure time and to intend the following two processes:

(1) A physical block 1110 having a smaller erasure count is allocated to a logical block 1100 having a stronger possibility of receiving a write request (a larger write count) in the future; and (2) A physical block 1110 having a larger erasure count is allocated to a logical block 1100 having a weaker possibility of receiving a write request (a smaller write count) in the future.

As shown in FIG. 10A, the exchange write process is performed when a logical block 1100 having a larger write count corresponding to a physical block 1110 (old physical block 2000) having a larger erasure count receives a write request. At this time, a physical block 1110 having a smaller erasure count and corresponding to a logical block 1110 having a smaller write count (hereinafter referred to as a data-copy-from physical block 2020) is detected, and write data is written into a free physical block 1120 as a data-write-in physical block 2010 and belonging to the same erasure count group 1280 as the data-copy-from physical block 2020. The data written in the data-copy-from physical block 2020 is copied to a free physical block 1120 (physical block to which data is to be copied 2030, which is hereinafter abbreviated as a "data-copy-to physical block" 2030) belonging to the same erasure count group 1280 as the old physical block 2000. Finally, the data-copy-from physical block 2020 and the old physical block 2000 are erased to thereby complete the exchange write process. As will be described later, the data in the respective tables is updated simultaneously with those processes. FIG. 10B shows the logical-physical block correspondence and the state of the respective block groups after the exchange write process has ended.

By performing such exchange write process, a logical block 1100 having a smaller eraser count corresponds to a logical block 1100 having a larger write count while a logical block 1100 having a larger erasure count corresponds to a logical block 1100 having a smaller write count. Thus, the exchange write process causes a physical block 1110 having an extremely larger erasure count and a physical block 1110 having an extremely smaller erasure count to disappear to thereby equal the erasure counts of the physical blocks substantially.

Figure 11:
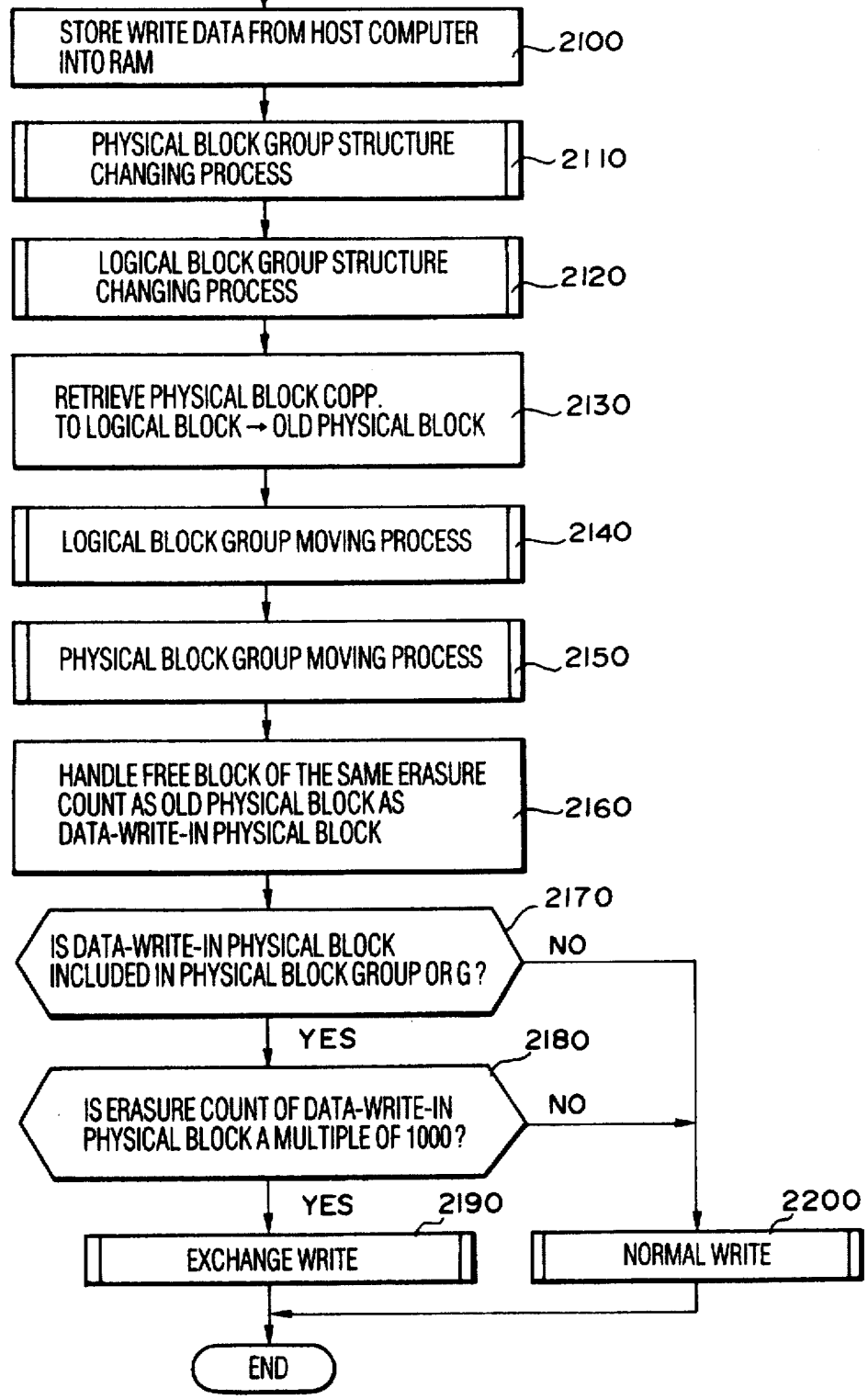
FIG. 11 is a main flow chart indicative of a write process corresponding to the first embodiment.

The write process will be described more specifically with reference to FIGS. 11–17. FIG. 11 is a main flow chart indicative of the write process.

First, in step 2100 the host interface 1020 stores write data from the host computer 1010 in the RAM 1030. A physical block group structure changing process to be described later is performed (step 2110). A logical block group changing process to be described later is performed (step 2120). The CPU 1050 retrieves the logical block table 1400 to extract a physical block 1110 corresponding to the logical block 1100 in which data is to be written 1100, which is hereinafter abbreviated as "data-write-in logical block" 1100 and handles it as an old physical block 2000 (step 2130). A logical block group moving process to be described later is performed (step 2140). A physical block group moving process to be described later is performed (step 2150). A free physical block 1120 belonging to the same erasure count group 1280 as the old physical block 2000 is handled as a data-write-in physical block 2010 (step 2160). In step 2170 the CPU 1050 checks the erasure count 1530 of the physical block table 1500 to determine whether the data-write-in physical block 200 is contained in the physical block group F1260 or G1270 or whether the erasure count of the data-write-in physical block 2010 is larger. If not, in step 2200 the normal write process to be described later is performed. If so, in step 2180 the CPU 1050 determines whether the erasure count of the data-write-in physical block 2010 is a multiple of 1000. If so, in step 2190 the exchange write process to be described later is performed. If not in step 2180, the normal write process is performed in step 2200.

While in step 2180 the value of 1000 is used in the present embodiment, the present invention is not limited to this particular value.

A physical block group structure changing process 2110 will be described next. In the present embodiment, the physical block group 1200 is defined such that the average erasure count of the physical blocks 1110 belongs initially to the physical block group D1240. Thus, when the average erasure count increases and the physical blocks 1110 belong to the physical block group E1250, the structure of the physical block group 1200 is required to be changed such that the physical blocks 1110 belonging to the physical block group E1250 are included in the physical block group D1240 at that time. Similarly, the physical block groups A1210 and B1220 are required to be included in the physical block group A, the physical block group C1230 is required to be moved into the physical block group B1220, the physical block groups D1240 is required to be moved into the physical block group C1230, and the physical block group F1260 is required to be moved into the physical block group E1250. The physical block group G1270 is divided into the physical block groups F1260 and G1270 according to erasure count.

Figure 12:
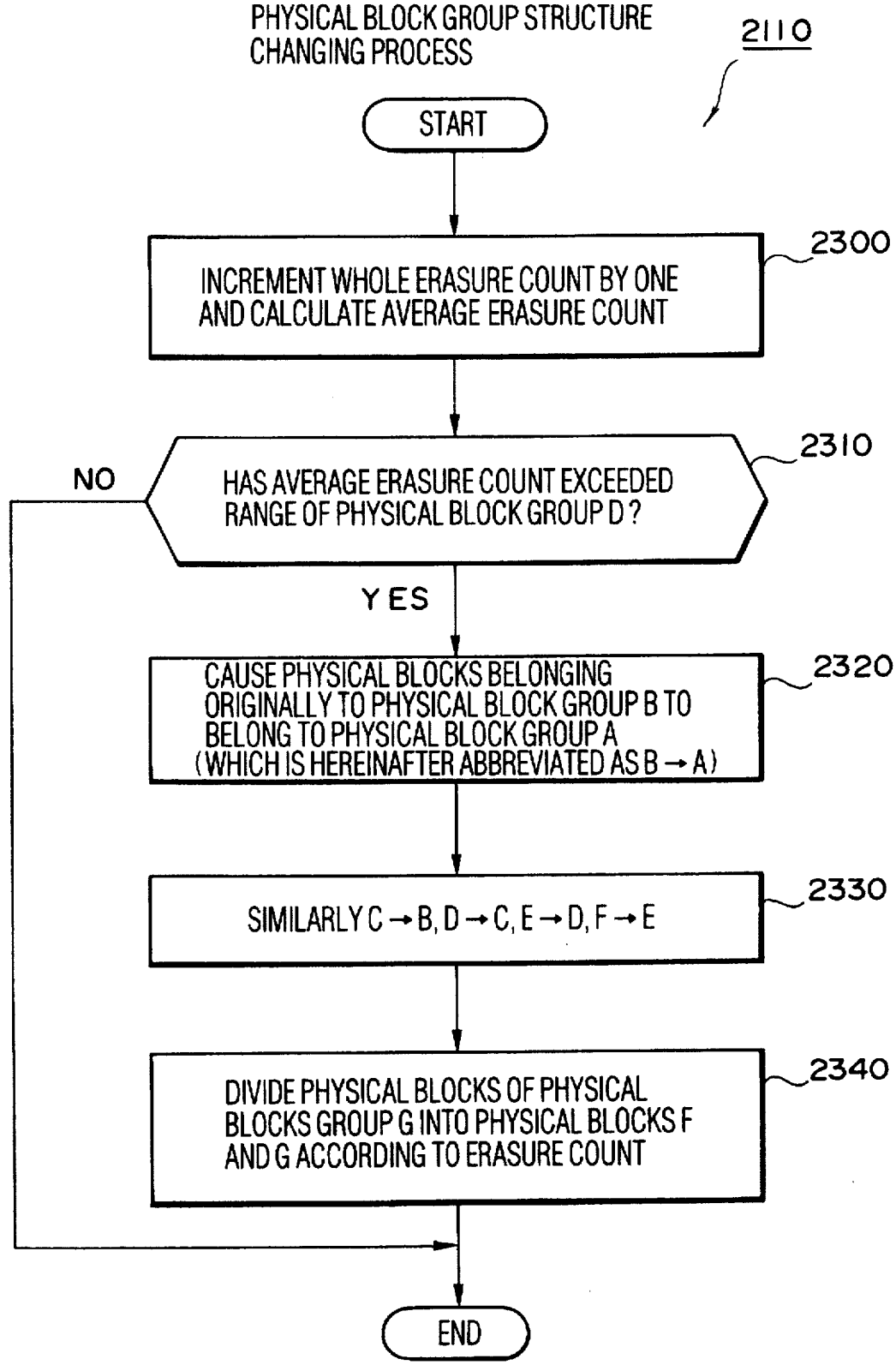
FIG. 12 is a flow chart indicative of a physical block group structure changing process.

FIG. 12 is a flow chart indicative of such physical block group structure changing process 2110, which is performed as a part of the write process (in step 2110 of FIG. 11). First, in step 2300 the total erasure count is incremented by one and the average erasure count is calculated. In step 2310 the CPU 1050 determines whether the average erasure count (FIG. 3) has exceeded the range of the physical block group D1240 (having the average erasure count). If not, control exits the process of FIG. 12. That is, if the average erasure count is on the boundary of the current physical block group, the structure of the physical block group is changed. If the average erasure count is beyond the range of the physical block group D1240, in step 2320 the group table 1620 is changed and the group queue 1800 is reconnected such that all the physical blocks 1110 belonging to the physical block group B1220 belong to the physical block group A1210. At this time, on the basis of the write count of the logical block 1100 corresponding to the physical block 1110, the group queues 1800 of the logical block group 1300 corresponding to the logical block 1100 and the group queue of the free physical block 1120 are reconnected. Similarly, the respective group queues 1800 are reconnected such that the physical blocks 1110 belonging to the physical block group C1230 belong to the physical block group B1220, that the physical blocks 1110 belonging to the physical block group D1240 belong to the physical block group C1230, that the physical blocks 1110 belonging to the physical block group E1250 belong to the physical block group D1240, and that the physical blocks 1110 belonging to the physical block group F1260 belong to the physical block group E1250 (step 2330). For the physical block group G1270, the group queues 1800 are reconnected such that the physical blocks 1110 having an erasure count of m+2,000 to m+2,999 belong to the physical block group F1260 and that the physical blocks 1110 having an erasure count of m+3,000 or more belong to the physical block group G1270, where m is a new reference erasure count which satisfies the condition "m≦average erasure count<m+1,000" and which is a multiple of 1,000 (step 2340). The physical blocks of the physical block group G are grouped into two physical block groups F and G according to erasure count.

A logical block structure changing process 2120 will be described next. In the present embodiment, the average write count of the logical blocks 1100 is defined so as to belong necessarily to the logical block group D1340. Thus, when the average write count of the logical blocks increases and they belong to the logical block group E1350, the structure of the logical block group 1300 is required to be changed such that the logical block 1100 which belonged to the logical block group E1350 at the time is included in the logical block group D1340. Similarly, the logical block groups A1310 and B1320 are required to be moved into the logical block group A1310, the logical block group C1330 is required to be moved into the logical block group B1320, the logical block group D1340 is required to be moved into the logical block group C1330, and the logical block group F1360 is required to be moved into the logical block group E1350. The logical block group G1370 is divided into the logical block groups F1360 and G1370 according to write count.

Figure 13:
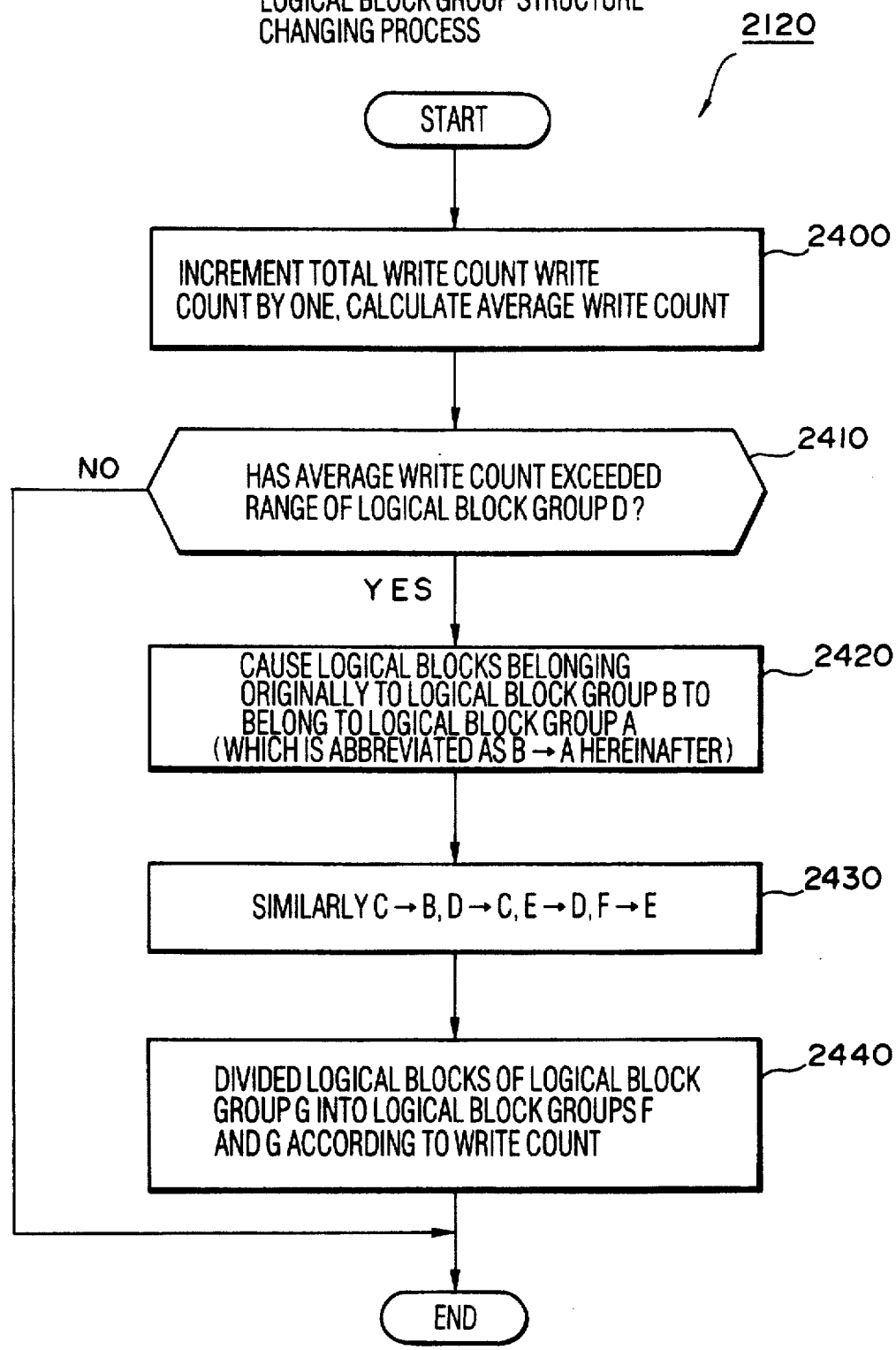
FIG. 13 is a flow chart indicative of a logical block group structure changing process.

FIG. 13 is a flow chart indicative of such logical block group structure changing process 2120, which is performed as a part of the write process (in step 2110 of FIG. 11). First in step 2400 the total write count is incremented by one and the average write count is calculated. In step 2410 the CPU determines whether the average write count has exceeded the range of the logical block group D1340 (having the average write count). If not, control exits the process of FIG. 13. That is, if the average write count is on the boundary of the current logical block group, the structure of the logical block group is changed. If the average write count is beyond the range of the logical block group D1340, in step 2420 the group table 1620 is changed and the group queue 1800 is reconnected such that all the logical blocks 1100 belonging to the logical block group B1320 belong to the logical block group A1310. At this time, on the basis of the erasure counts of the physical blocks 1110 corresponding to the logical blocks 1100, the group queues 1800 of the physical block group 1200 corresponding to the logical blocks 1100 are reconnected. Similarly, the respective group queues 1800 are reconnected such that the logical blocks 1110 belonging to the logical block group C1330 belong to the logical block group B1320, that the logical blocks 1100 belonging to the logical block group D1340 belongs to the logical block group C1330, that the logical blocks 1100 belonging to the logical block group E1350 belong to the physical block group D1340, and that the logical blocks 1100 belonging to the logical block group F1360 belongs to the logical block group E1350 (step 2430).

For the logical block group G1370, the group queues 1800 are reconnected such that the logical block 1110 having a write count of n+2,000 to n+2,999 belongs to the logical block group F and that the logical blocks 1100 having a write count of n+3,000 or more belong to the logical block group G, where n is a new reference write count which satisfies the condition "n≦average write count<n+1,000" and which is a multiple of 1,000 (step 2440). That is, the logical blocks of the logical block group G are divided into two new logical block groups F and G according to write count.

Figure 14:
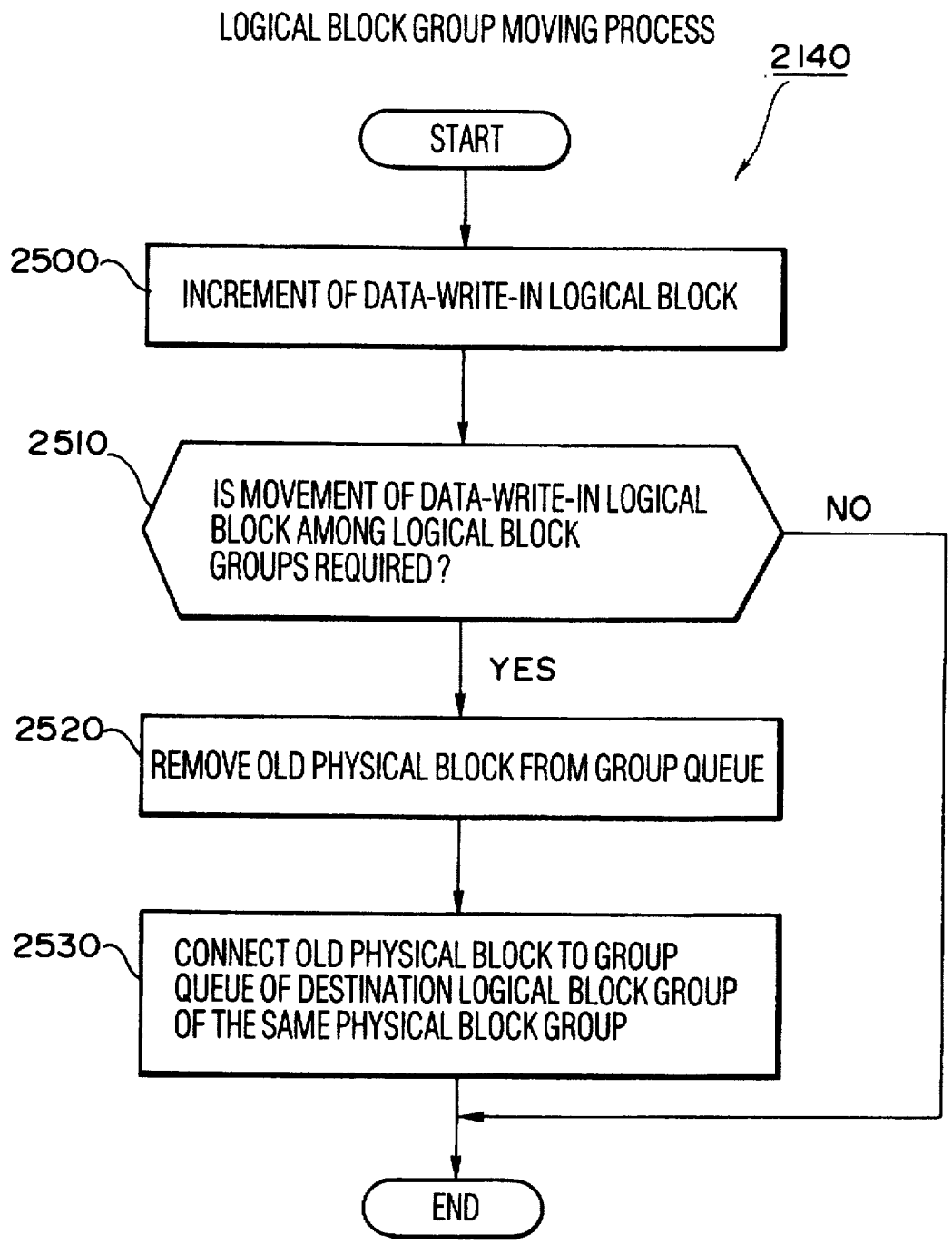
FIG. 14 is a flow chart indicative of a logical block group moving process.

A logical block group moving process 2140 will be described next with reference to FIG. 14, which is performed as a part of the write process (step 2140 of FIG. 11).

First, in step 2500 the write count of the data-write-in logical block 1000 is incremented by one. It is then determined in step 2510 whether the write count of the data-write-in logical block 1100 has exceeded the range of the logical block group 1300 to which the write count of the data-write-in logical block 1100 has belonged so far and the movement of that logical block 1100 to another logical block group 1300 is required. If not, control ends. If so in step 2520, the old physical block 2000 corresponding to the logical block 1100 which has received the write request is removed from the group queue 1800. In step 2530 the old physical block 2000 is connected to the group queue 1800 of a destination logical block group 1300 of the same physical block group 1200.

Figure 15:
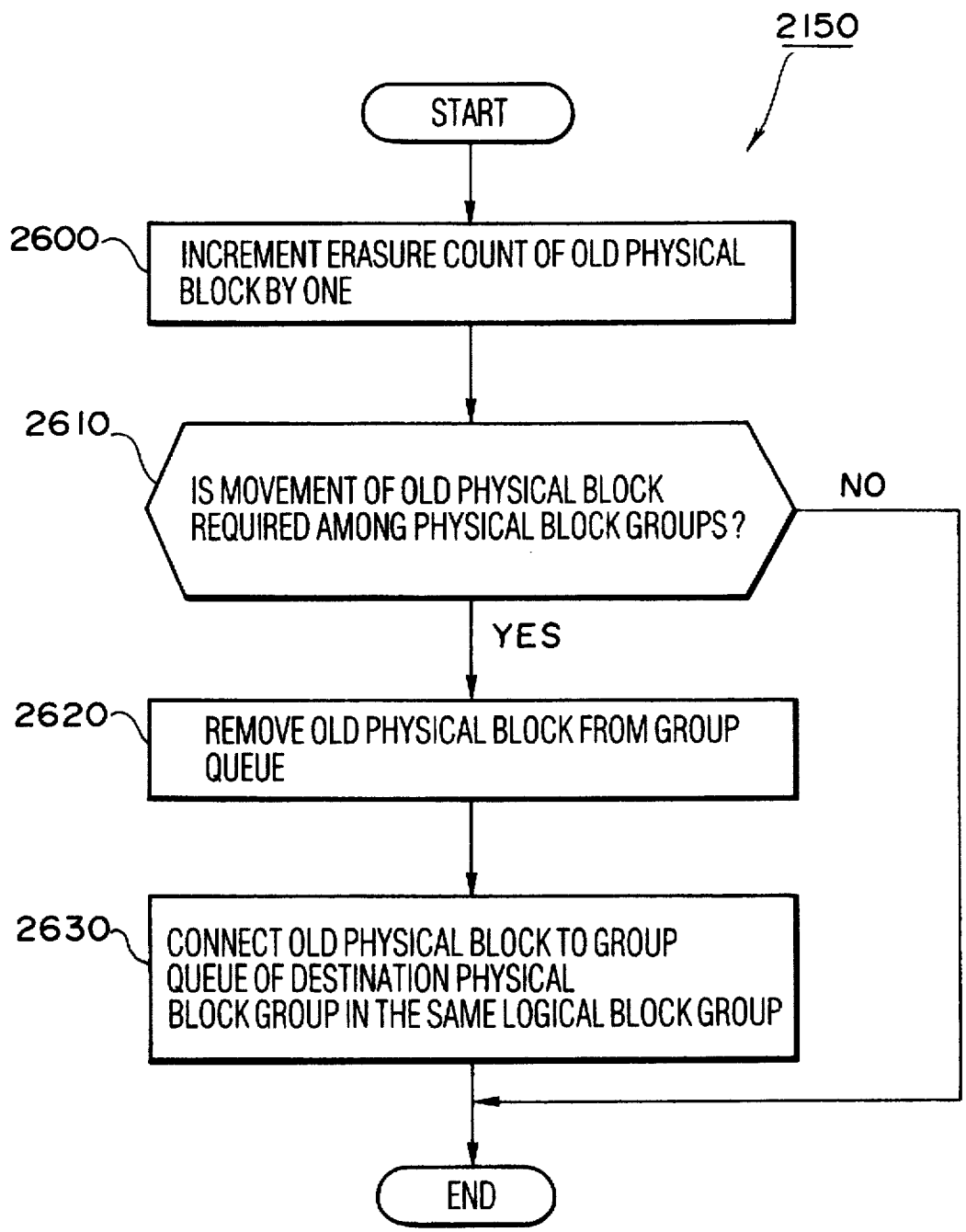
FIG. 15 is a flow chart indicative of a physical block group moving process.

A physical block group moving process 2150 will be described with reference to FIG. 15, which is performed as a part of the write process (step 2150 of FIG. 11). First, in step 2600 the erasure count of the old physical block 2000 corresponding to the data-write-in logical block 1100 is incremented by one. It is then determined in step 2610 whether the erasure count of the old physical block 2000 has exceeded the range of the physical block group 1200 to which the old physical block 2000 has belonged so far and the movement of the old physical block 2000 to another physical block group 1200 is required. If not, control ends. If so in step 2620, the old physical block 2000 is removed from the group queue 1800. In step 2630 the old physical block 2000 is connected to the group queue 1800 of a destination physical block group 1200 in the same logical block group 1300.

Figure 16:
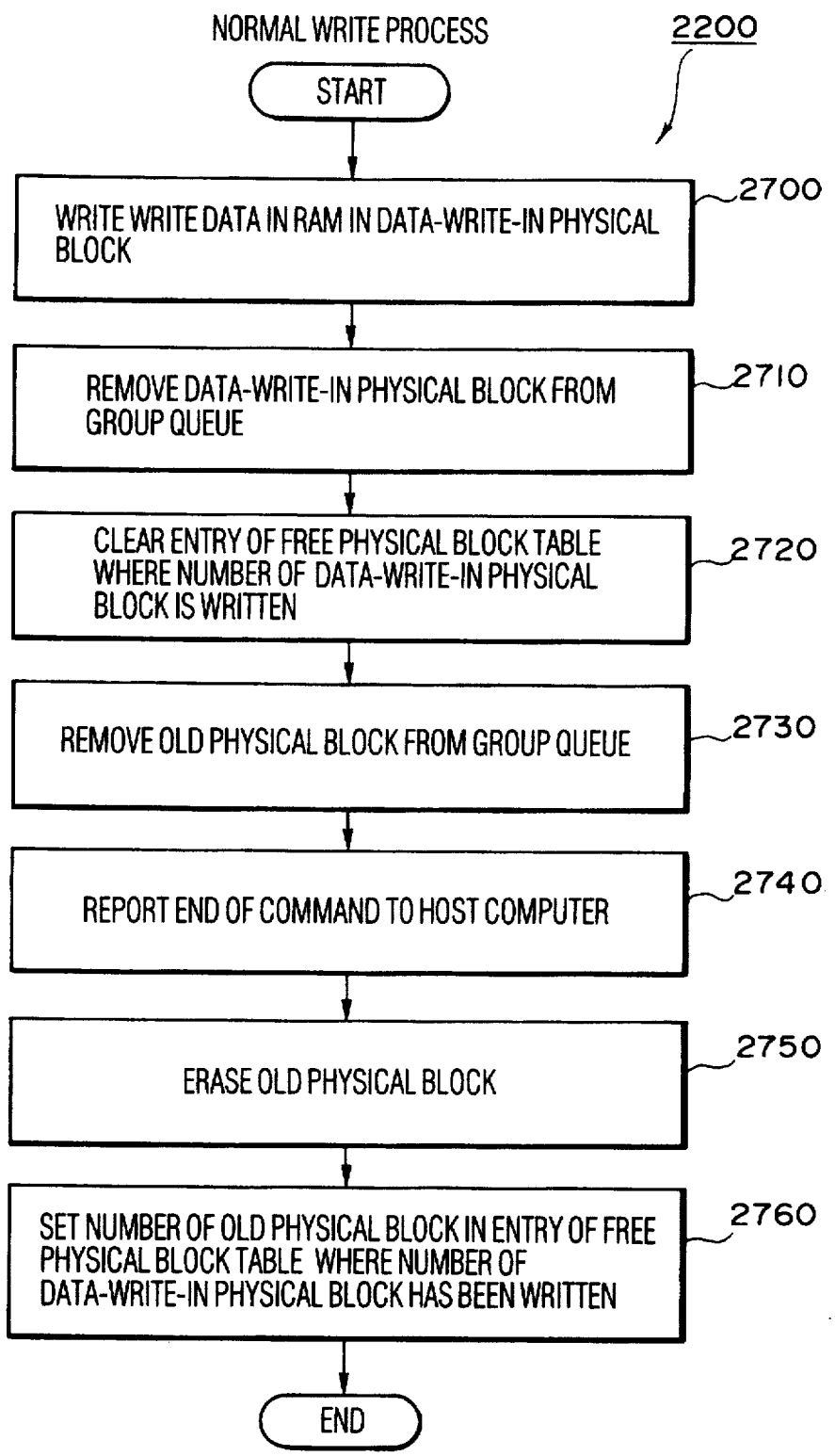
FIG. 16 is a flow chart indicative of a normal write process corresponding to the first embodiment.

FIG. 16 is a flow chart indicative of a normal write process 2200, which corresponds to the step 2200 of FIG. 11.

First, in step 2700 the write data in the RAM 1030 is written into a data-write-in physical block 2010. Next, the data-write-in physical block 2010 is removed from the group queue 1800 (step 2710). The entry of the erasure count group 1280, to which the data-write-in physical block 2010 belongs, in the free physical block table 1600 is cleared (step 2720). The old physical block 2000 is then removed from the group queue 1800 (step 2730). At this time, the end of the command is reported to the host computer 1010 (step 2740). The subsequent process is performed in the background, i.e., in the memory system 1000 irrespective of the host computer 1010. The old physical block 2000 is then erased (step 2750). The number of the old physical block 2000 is set in the entry of the free physical block table 1600 cleared in step 2720 (step 2760).

Figure 17:
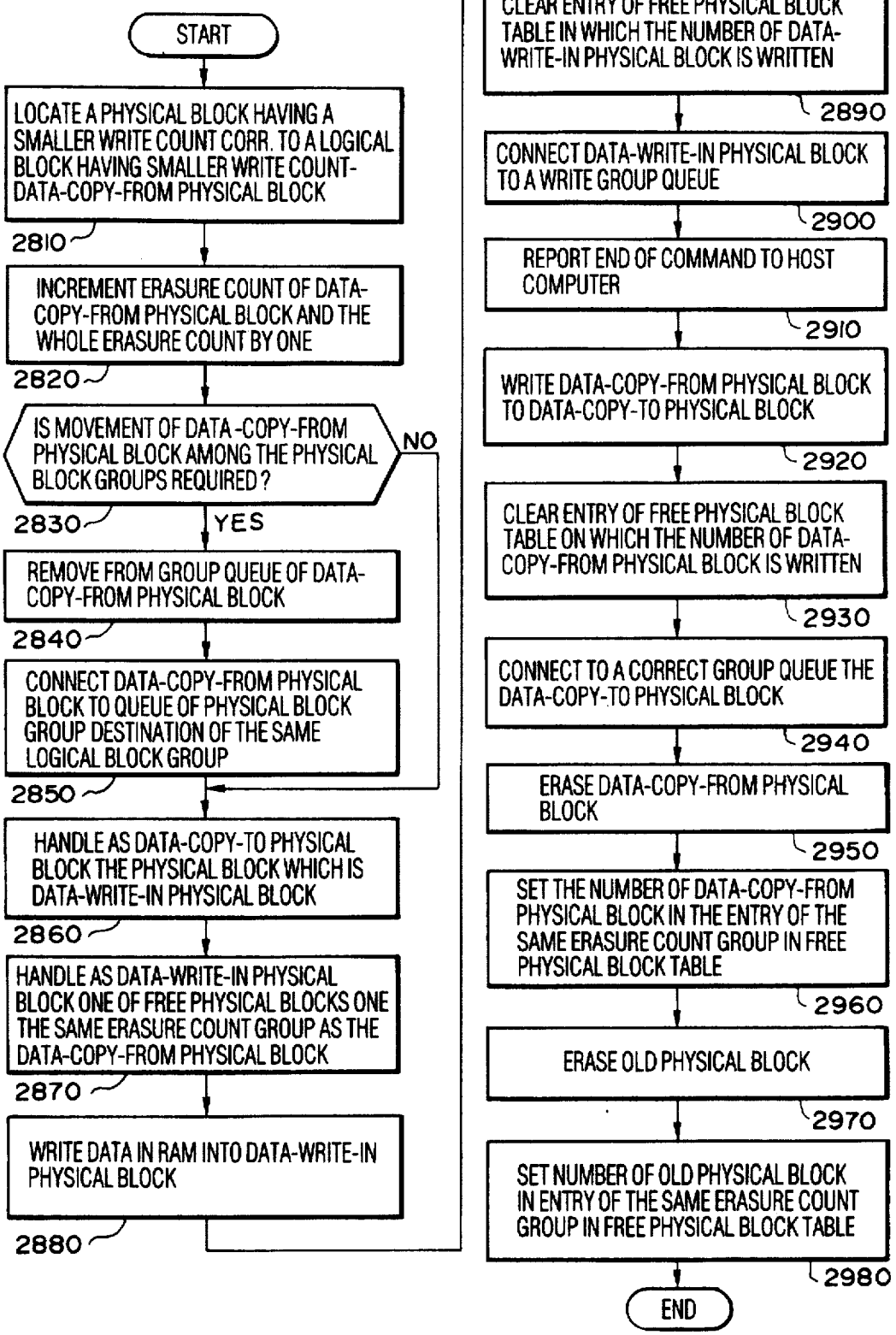
FIG. 17 is a flow chart indicative of an exchange write process corresponding to the first embodiment.

FIG. 17 is a flow chart indicative of an exchange write process 2190, which corresponds to the step 2190 of FIG. 11.

In step 2810 a physical block 1110 having a smaller erasure count corresponding to a logical block 1100 having a smaller write count is retrieved on the basis of the group table 1620 (FIG. 7) and is handled as a data-copy-from physical block 2020. A specified method of extracting the data-copy-from physical block 2020 is as follows:

(1) The group queues 1800 of the logical block groups A, B, C and D are sequentially retrieved in this order. And each queues are contained in the group table entry of the physical block group A, and the first extracted physical block 1110 and the corresponding logical block 1100 are selected. Unless there is no such physical block, the following process (2) is performed;

(2) The group queues 1800 of the logical block groups A, B, C and D are sequentially retrieved in this order. And each queues are contained in the group table entry of the physical block group B, and the first extracted physical block 1110 and the corresponding logical block 1100 are selected. Unless there is no such physical block, the following process (3) is performed;

(3) The group queues 1800 of the logical block groups A, B, C and D are sequentially retrieved in this order. And each queues are contained in the group table entry of the physical block group C, and the first extracted physical block 1110 and the corresponding logical block 1100 are selected. Unless there is no such physical block, the following process (4) is performed; and (4) The group queues 1800 of the logical block groups A, B, C and D are sequentially retrieved in this order. And each queues are contained in the group table entry of the physical block group D, and the first extracted physical block 1110 and the corresponding logical block 1100 are selected.

Each of the erasure count of the data-copy-from physical block 2020 and the total erasure count is incremented by one (step 2820).

It is then determined whether the movement of the data-copy-from physical block 2020 is required among the physical block group 1200 (step 2830). If so, the data-copy-from physical block 2020 is removed from the group queue 1800 (step 2840) and is connected to the group queue 1800 of a destination physical block group 1200 included in the same logical block group 1300 (step 2850). If not in step 2830, no processes in those two steps 2840 and 2850 are performed.

Then, in step 2860 the physical block 1110 which is the data-write-in physical block 2010 is handled as a data-copy-to physical block 1110. A free physical block included in the same erasure count group 1280 as the data-copy-from physical block is handled as a new data-write-in physical block 2010 (step 2870). Write data in the RAM is written into the data-write-in physical block 2010 (step 2880). An entry of a free physical block table 1600 corresponding to the erasure count group 1280 to which the data-write-in physical block 2010 belongs is cleared (step 2890). In step 2900 the data-write-in physical block 2010 is connected to a correct group queue 1800, which implies that the data-write-in physical block 2010 is connected to the group queue 1800 which corresponds to the logical block group 1300 which includes the data-write-in logical block, and the physical block group 1200 which includes the data-write in physical block 2010.

The host interface 1020 reports the end of the command to the host computer 1010 (step 2910). The subsequent process is performed in the background, i.e., in the memory system 1000 irrespective of the host computer 1010.

In step 2920 data in the data-copy-from physical block 2020 is written temporarily into the RAM 1030 and thence into the data-copy-to physical block 2030. An entry of a free physical block table 1600 corresponding to the erasure count group 1280 to which the data-copy-to physical block 2030 belongs is cleared (step 2930). In step 2940 the data-copy-to physical block 2030 is connected to a correct group queue 1800, which implies the same matter as mentioned above. The data-copy-from physical block is then erased (step 2950). The physical block number of the data-copy-from physical block 2020 is then set in the entry of the erasure count group 1280 which includes the data-copy-from physical block 2020 in the free physical block table 1600 (step 2960). The old physical block 2000 is then erased (step 2970). The physical block number of the old physical block 2000 is then set in the entry of the erasure count group 1280 which includes the old physical block 2000 in the free physical block table 1600 (step 2980).

While in the present embodiment the write count of the logical block 1100 has been used as management information, the write frequency (time differentiation of the write count) of the logical block 1100 may be used instead. The write frequency is the count of a counter incremented by one each time a write process is performed like the total write count and is cleared to 0 periodically, for example once every three days, so that the write frequency expresses the latest write count or frequency.

In the present embodiment, one free physical block 1120 is prepared for each erasure count group. Thus, when data having a size corresponding to two or more logical blocks 1100 is required to be written and corresponds to the physical block 1110 belonging to the same physical block group 1200, no erasure time can be concealed in the write process of data into the second and subsequent physical blocks 1110. However, if two or more free physical blocks 1120 are prepared for each erasure count group, and if (1) the data write processes are performed collectively, (2) the completion of the write processes is reported to the host computer 1010 and (3) required data erasure processes are performed collectively, the erasure time can be concealed from the host computer 1010 even in the above case, i.e., where the data having a size corresponding to two or more logical blocks 1100 is required to be written and corresponds to the physical block 1110 belonging to the same physical block group 1200.

A memory system 1001 having a data compressing function and using a flash memory will be described as a second embodiment of the present invention below.

Figure 18:
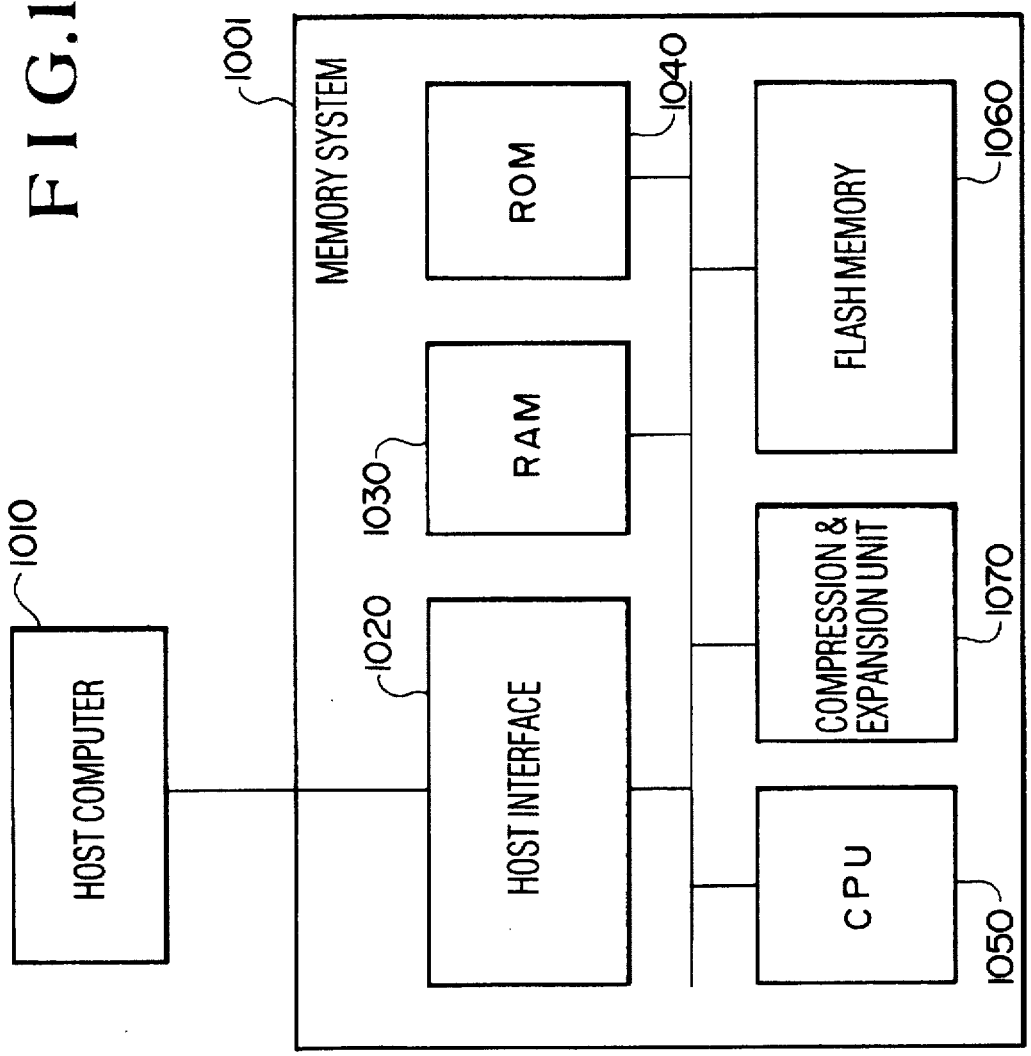
FIG. 18 is a block diagram indicative of an illustrative construction of a memory system using a flash memory as a second embodiment of the present invention.

FIG. 18 shows the memory system 1001 of the second embodiment, which has a structure which includes a combination of the memory system 1000 of FIG. 1 and a compression and expansion unit 1070.

In the present embodiment, one logical block 1000 corresponds to one-eight physical blocks 1110 in dependence on the degree of data compression. Each logical block 1100 has a size corresponding to eight physical blocks 1110, so that a maximum of eight physical blocks 1110 can be used to store data in the logical block 1100 which can not be compressed at all. In the present embodiment, a logical space which is twice as large as the actual physical space is accessible by the host computer 1010 in consideration of data compression. That is, the whole size of the logical blocks 1100 is twice as that of the physical blocks 1110. Since the number of physical blocks 1110 corresponding to the logical block 1100 varies between one and eight in dependence on the compression rate, a free physical block 1120 is not prepared for each erasure count group 1280 as is in the first embodiment and all physical blocks 1110 which have no effective data stored therein are managed as free physical blocks 1120. In this case, no physical block 1110 is caused to correspond to a logical block 1100 in which no data is written even once.

Only the points of the first embodiment different from those of the second embodiment due to introduction of the compression function will be described next.

Figure 19:
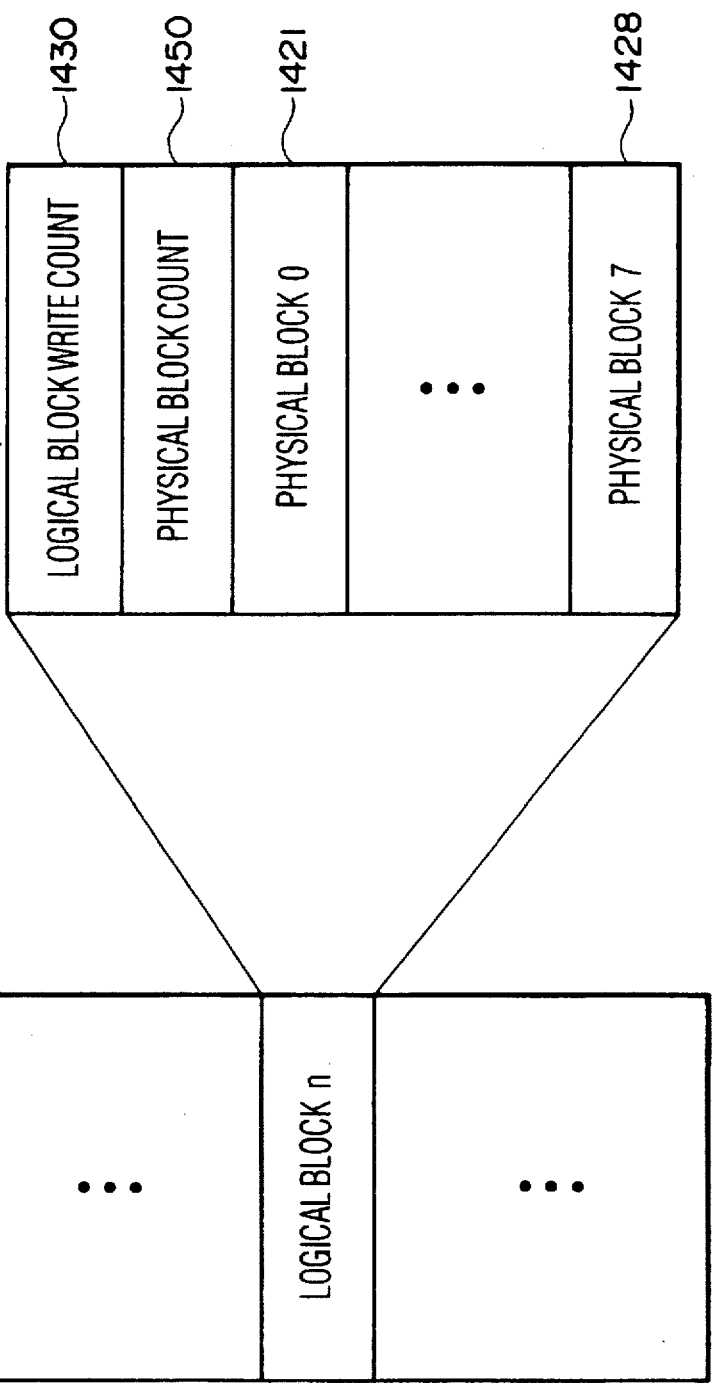
FIG. 19 illustrates a logical block table and its entry, corresponding to the second embodiment.

FIG. 19 shows a logical block table 1401 and its entry 1411 in the second embodiment. The logical block table entry 1411 has information on a logical block write count 1430, physical block count 1450 corresponding to the logical block 1100, and eight corresponding physical block numbers 1421-1428.

Figure 20:
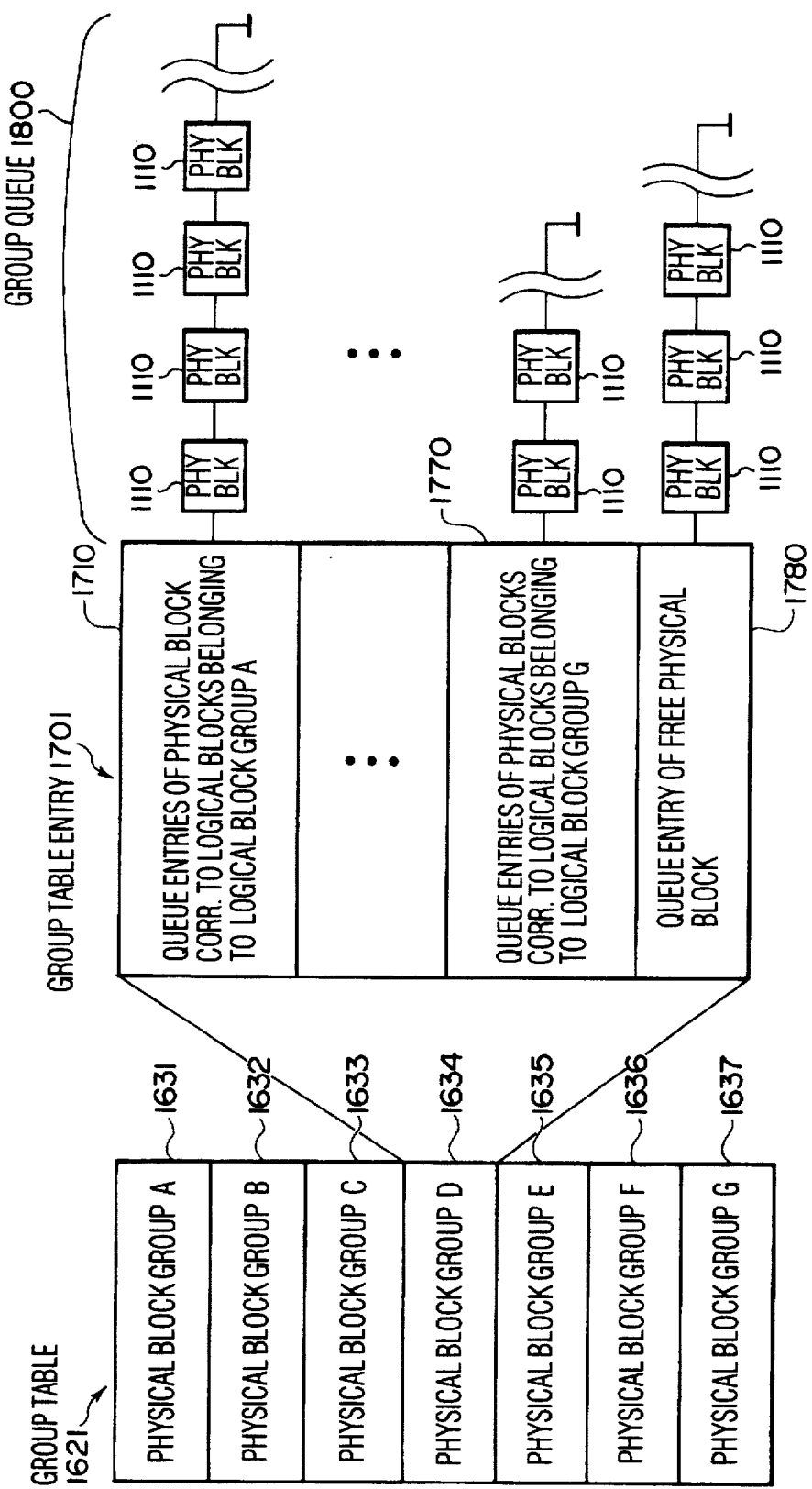
FIG. 20 illustrates a free physical block table, group table, its entry and group queue, corresponding to the second embodiment.

FIG. 20 shows a group table 1621, its entries 1701 and group queues 1800 in the second embodiment. The group table 1621 has entries 1631-1637 of physical block groups A-G each depending on an erasure count, with each entry 1701 including queue entries 1710-1770 for the respective logical block groups in dependence on the write count. In the second embodiment, the free physical block 1120 is also managed by queue. Thus, the group table entry 1701 further has a queue entry 1780 of the free physical block 1120.

In the read process, the expansion of the compressed data is required. Thus, after step 1910 of FIG. 8, the read data is expanded and the resulting data is transferred to the host computer 1010.

The write process requires the compression of the write data. The number of physical blocks 1110 required for storage can change in dependence on the compression rate of the write data, so that allocation of a free data-write-in physical block 1120 becomes complicated.

Figure 21:
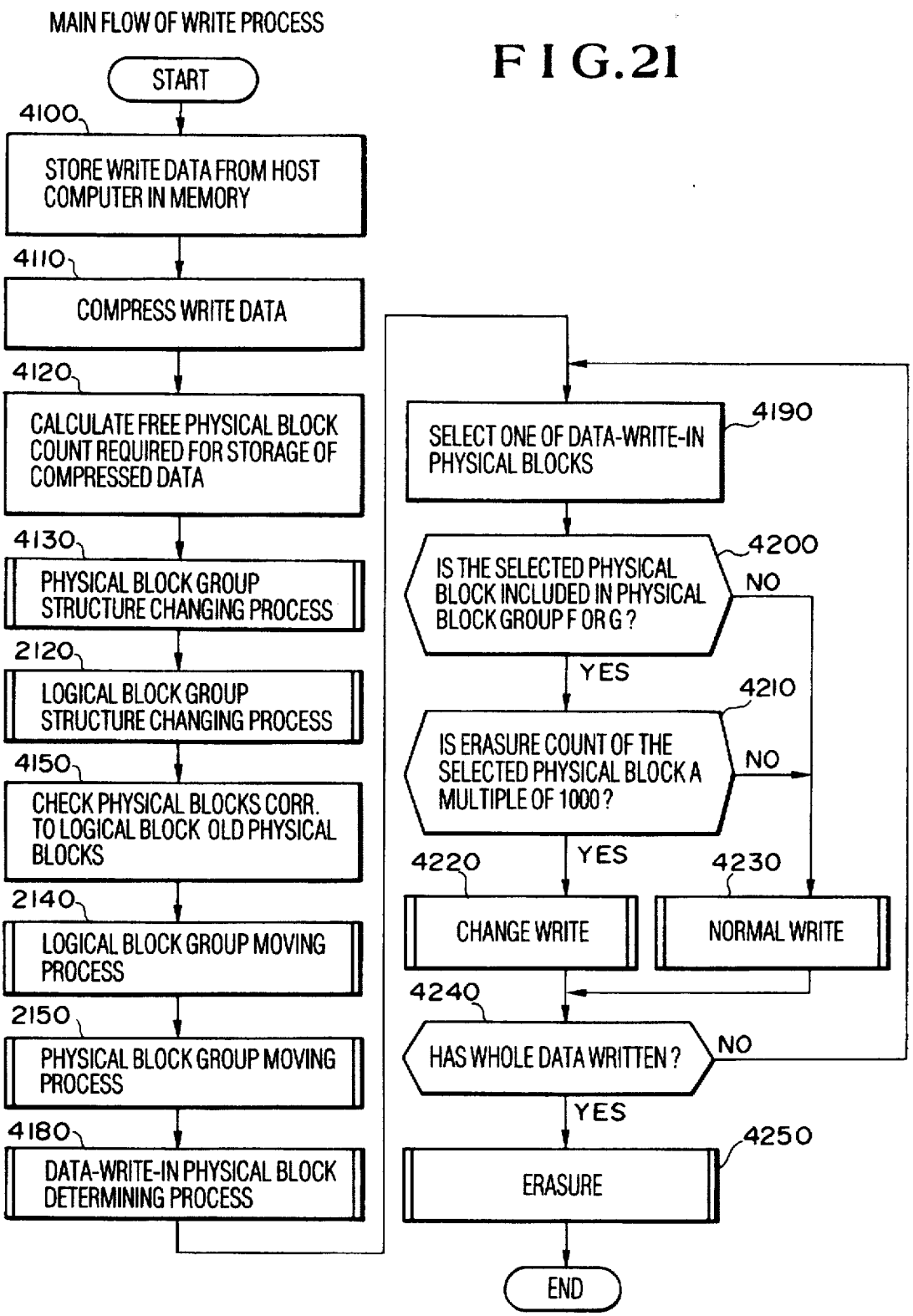
FIG. 21 is a main flow chart indicative of a write process corresponding to the second embodiment.

FIG. 21 is a main flow chart indicative of the write process in the second embodiment, which is different in many points from the first embodiment, so that the whole write process of the second embodiment will be described next.

First, in step 4100 a host interface 1020 stores write data from the host computer 1010 into the RAM 1030. The compression/expansion unit 1070 compresses write data (step 4110). The CPU 1050 calculates the number of free physical blocks 1120 required for storage of the compressed data (step 4120). A physical block group structure changing process to be described later is performed (step 4130). The logical block group structure changing process (FIG. 13) is then performed (step 2120). The CPU 1050 checks the logical block table 1401 to locate a plurality of physical blocks 1110 corresponding to the data-write-in logical block 1100 and handles them as the old physical blocks 2000 (step 4150). The logical block group moving process of FIG. 14 is then performed (step 2140). The physical block group moving process of FIG. 15 is then performed (step 2150). A data-write-in physical block determining process which will be described later is then performed (step 4180). The CPU 1050 selects one of the data-write-in physical blocks 2010 and handles it as a data-write-in physical block 2011 (step 4190).

In step 4200 the CPU 1050 checks the erasure count 1530 of the physical block table 1500 to determine whether the data-write-in physical block 2011 is included in the physical block group F1260 or G1270. If not, in step 4230 the CPU 1050 performs a normal write process to be described later. If so in step 4200, the CPU 1050 further determines in step 4210 whether the erasure count of the data-write-in physical block 2011 is a multiple of 1000. If so, in step 4220 the CPU 1050 performs an exchange write process to be described later. If not in step 4210, the CPU 1050 performs the normal write process in step 4230.

In step 4240 the CPU 1050 determines whether the whole write data has been written into the data-write-in physical block 2010. If not, control passes to step 4190. Finally, the CPU 1050 performs the erasure process to be described later in more detail (step 4250).

The physical block group structure changing process 4130 is different from the physical block group structure changing process 2110 of FIG. 12 in its step 2300. That is, in the second embodiment, the number of physical blocks 1110 required for storage of compressed data is added to the total erasure count, and the average erasure count is then calculated.

The data-write-in physical block determining process 4180 will be described next. In the second embodiment, one-eight data-write-in physical blocks 2010 are required in dependence on the compression rate of the write data. The number of data-write-in physical blocks 2010 can differ from that of old physical blocks 2000. Thus, when physical blocks 1120 required for storage of write data are not larger in number than the old physical blocks 2000, free physical blocks 1120 which have substantially the same write count as the old physical blocks corresponding to data-write-in physical blocks 2010 are required to be allocated to the old physical blocks 2000 in order to determine data-write-in physical blocks 2010 by placing the old physical blocks 2000 and the data-write-in physical blocks 2010 in one to-corresponding relationship. When the required free physical blocks 1120 are larger in number than the old physical blocks 2000, the write count of the logical block 1100 which has received a write request is required to be checked and a free physical block 1120 depending on the write count is required to be allocated in order to determine the data-write-in physical blocks 2010 which have no corresponding old physical blocks 2000.

Figure 22:
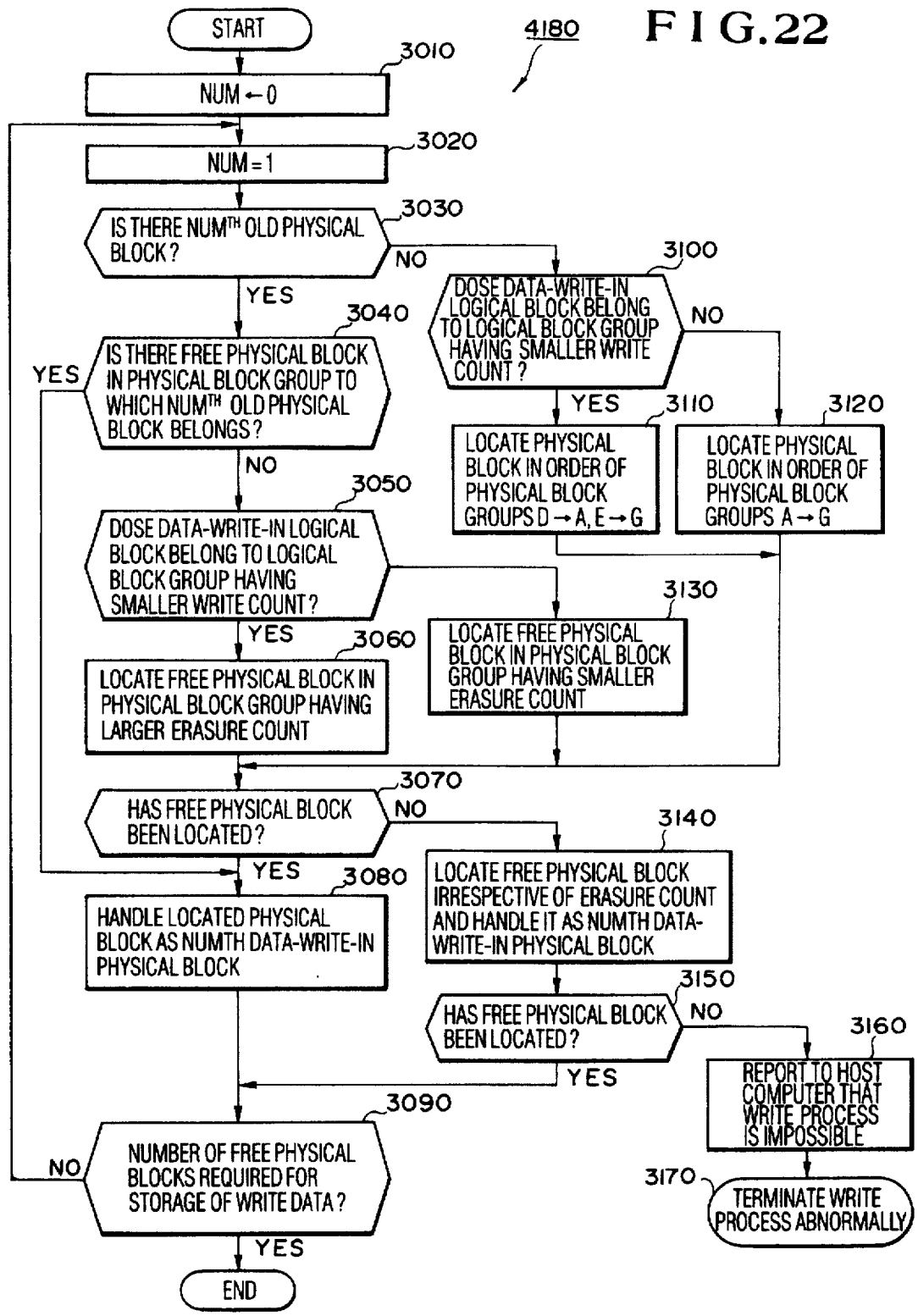
FIG. 22 is a flow chart indicative of a process for determining a physical block in which data is to be written.

The data-write-in physical block determining process 4180 will be described specifically with reference to a flow chart of FIG. 22 below. First, in step 3010 a variable num is set at 0. In step 3020 the variable num is incremented by one. In step 3030 it is determined whether there is a num-th old physical block 2000. If not, control passes to step 3100. If so in step 3030, it is determined in step 3040 whether there are any free physical blocks 1120 in the physical block group 1200 to which the num-th old physical block 2000 belongs. If so, control jumps to step 3080. If not in step 3040. it is determined in step 3050 whether the data-write-in logical block 1100 belongs to a logical block group 1300 having a relatively small write count, which specifically points out any one of the logical block groups A1310–C1330 of FIG. 4. If the write count belongs to one of those groups, in step 3060 a free physical block 1120 is located in the physical block group 1200 having a larger erasure count which is as close as possible to the physical block group 1200 to which the num-th old physical block 2000 belongs. If not in step 3050, a free physical block 1120 is located in a physical block group 1200 having a smaller erasure count which is as close as possible to a physical block group 1200 to which the num-th old physical block 2000 belongs (step 3130). It is determined in step 3070 whether the free physical block has been discovered. If not, control jumps to step 3140. If so in step 3070, the located free physical block 1120 is handled as a num-th data-write-in physical block 2010 in step 3080.

It is then determined in step 3090 whether the num is equal to the number of free physical blocks 1120 required for storage of the write data or whether all the necessary free physical blocks 1120 have been ensured. If so, the data-write-in physical block determining process ends. If not, control returns to step 3020.

It is determined in step 3100 whether the data-write-in logical block 1100 belongs to a logical block group 1300 having relatively small write counts, which specifically points out the logical block groups A1310–C1330. If so, a free physical blocks 1120 is located in order of physical block groups D1240, C1230, B1220 and A1210, and then in order of physical block groups E1250, F1260 and G1270. Control then jumps to step 3070 (step 3110). If not in step 3100, a free physical block 1120 is located in order of physical block groups A1210, B1220, C1230, D1240, E1250, F1260 and G1270. Controls then jumps to step 3070 (step 3120).

In step 3140 any free physical block 1120 present at this time is located in any event, irrespective of the erasure count. If such physical block 1120 is located, it is handled as a num-th data-write-in physical block 2010. It is then determined in step 3150 whether any free physical block 1120 has been located. If so, control jumps to step 3090. If not in step 3150, the message "The write process is impossible" is sent to the host computer 1010 in step 3160 and the write process is terminated abnormally in step 3170.

Figure 23:
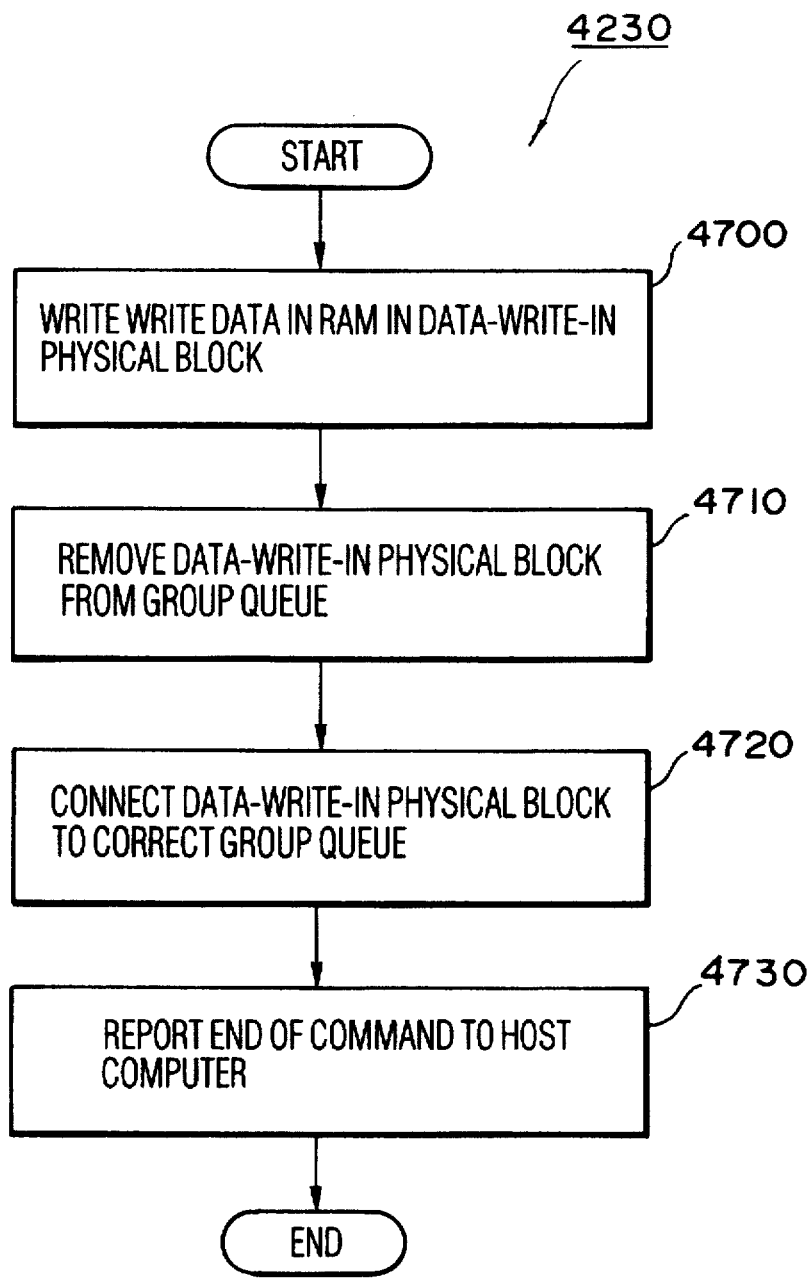
FIG. 23 is a flow chart indicative of a normal write process corresponding to the second embodiment.

FIG. 23 is a flow chart indicative of a normal write process 4230 in the second embodiment. First, in step 4700 unwritten compressed write data for one physical block in the RAM 1030 is written into a selected data-write-in physical block 2010, which is then removed from the group queue 1800 (step 4710) and connected to a correct group queue 1800 (step 4720). In step 4730 the end of the command is reported to the host computer 1010.

Figure 24:
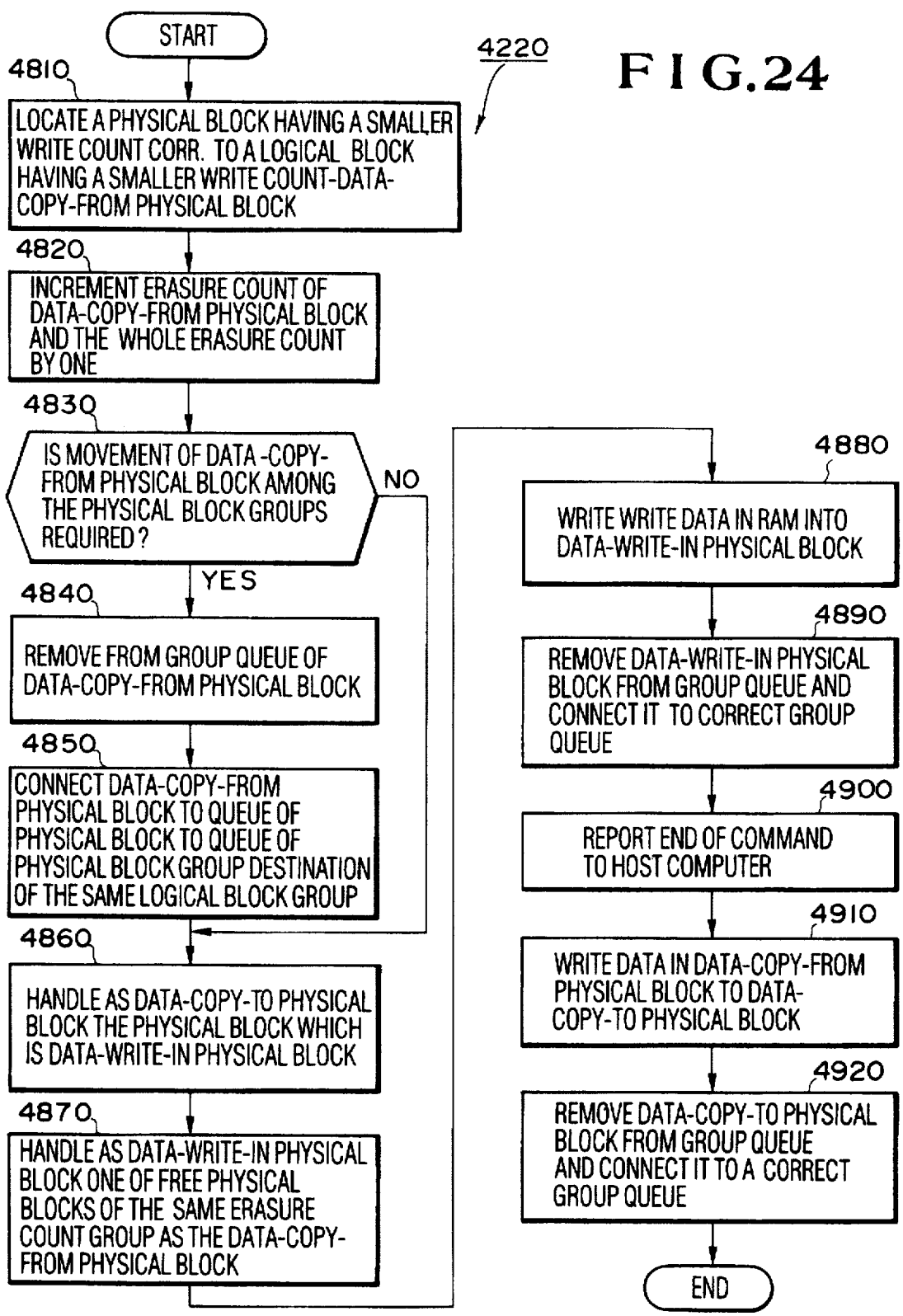
FIG. 24 is a flow chart indicative of an exchange write process corresponding to the second embodiment.

FIG. 24 is a flow chart indicative of an exchange write process 4220. First, in step 4810 one physical block 1110 having a smaller erasure count corresponding to a logical block 1100 having a smaller write count is located by viewing the group queue 1800 and handled as a data-copy-from physical block 2020. The erasure count of the data-copy-from physical block 2020 and the total erasure count are each incremented by one (step 4820). It is then determined whether the movement of the data-copy-from physical block 2020 is required among the physical block groups 1200 (step 4830). If so, the data-copy-from physical block 2020 is removed from the group queue 1800 (step 4840) and connected to the group queue 1800 of a destination physical block group 1200 and included in the same logical block group 1300 (step 4850). If not in step 4830, the processes in the above two steps 4840 and 4850 are not performed.

In step 4860 the physical block 1110 which is the selected data-write-in physical block 2010 is handled as a data-copy-to physical block 2030. A free physical block included in the same erasure count group 1280 as the data-copy-from physical block 2020 is handled a newly selected data-write-in physical block 2010 (step 4870). Write data in the RAM is written into the data-write-in physical block 2010 (step 4880). The selected data-write-in physical block 2010 is then removed from the group queue 1800 and connected to a correct group queue 1800 (step 4890).

At this time, the host interface 1020 reports the end of the command to the host computer 1010 (step 4900). The subsequent process is performed in the background, i.e., in the memory system 1001 irrespective of the host computer 1010. In step 4910 data in the data-copy-from physical block 2020 is temporarily written into the RAM 1030 and then written into the data-copy-to physical block 2030. In step 4920 the data-copy-to physical block 2030 is removed from the group queue 1800 and connected to a correct group queue 1800.

Figure 25:
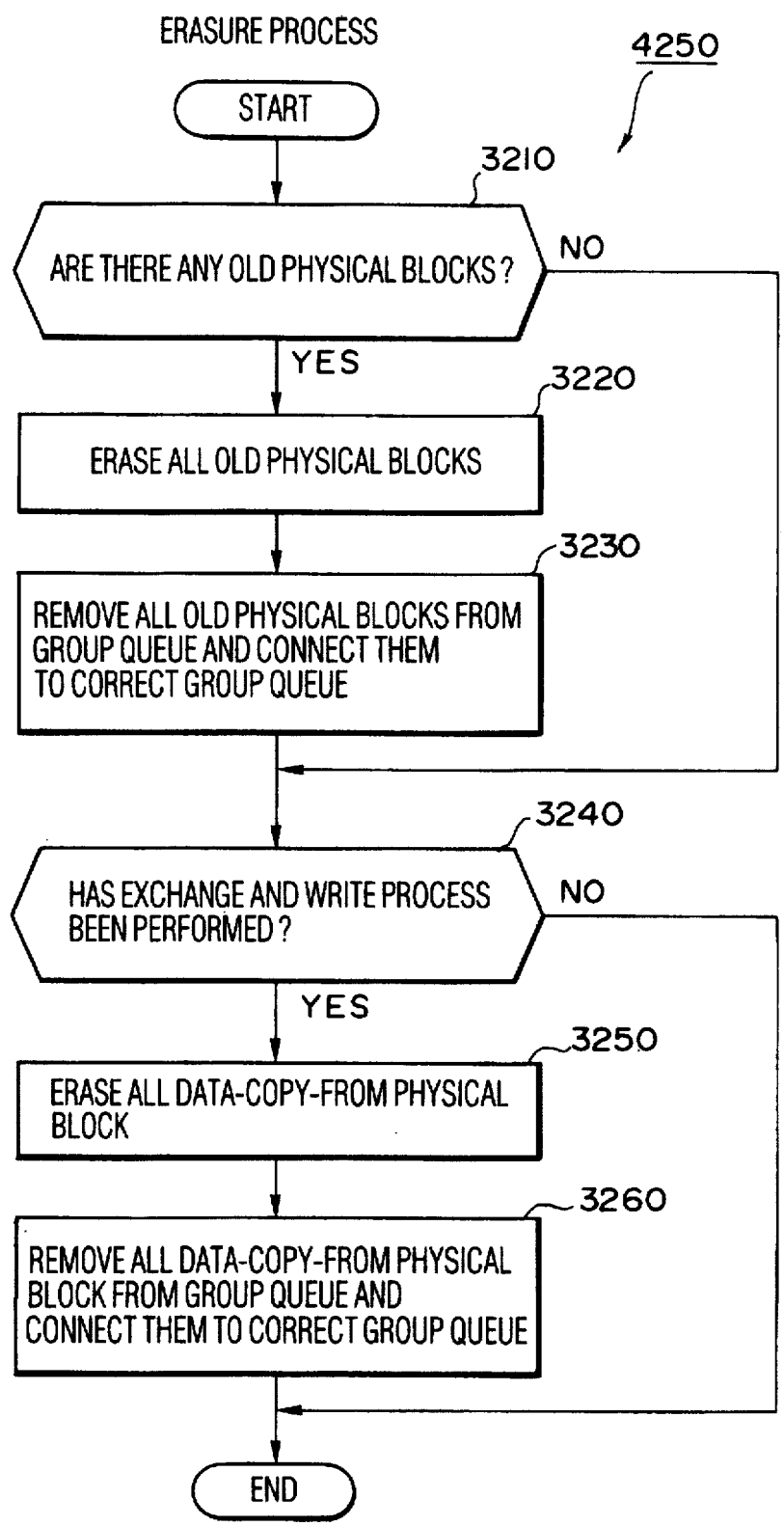
FIG. 25 is a flow chart indicative of an erasure process.

FIG. 25 is a flow chart indicative of an erasure process 4250. First, in step 3210 it is determined whether there are any old physical blocks 2000. When data is not overwritten, but written initially into a logical block 1100, this logical block 1100 has no corresponding physical block 1110. Thus, there are no old physical blocks 2000. In this case, controls jumps to step 3240. If there are old physical blocks 2000, they are all erased (step 3220). All the old physical blocks 2000 are then removed from the group queue 1800 and connected to a correct group queue (step 3230).

It is then determined in step 3240 whether an exchange write process 4220 has been performed by using a flag set in this process. If not, the erasure process ends. If so in step 3240, all the data-copy-from physical blocks 2020 are erased (step 3250). All the data-copy-from physical blocks 2020 are removed from the group queue 1800 and connected to a correct group queue (step 3260).

According to the present invention, erasure counts are equalized among a plurality of physical blocks to thereby realize a memory system which uses a flash memory and which is long in service life and high in response performance compared to the conventional memory system using flash memory.

What is claimed is:

1. A method of controlling a memory system using a flash memory wherein a logical block as a unit accessed by a computer is allocated to a physical block of the flash memory, comprising the steps of:

a) counting and managing a write count of each logical block unit each time data is written into that logical block;

b) counting and managing an erasure count of each physical block unit each time that physical block is erased;

c) classifying a plurality of logical blocks into a plurality of logical block groups according to write count;

d) classifying a plurality of physical blocks into a plurality of physical block groups according to erasure count; and e) allocating a logical block belonging to a logical block group having a larger write count to a physical block which belongs to a physical block group having a smaller erasure count when data is written into the logical block.

2. A method according to claim 1, wherein the step e) comprises the steps of beforehand preparing in each physical block group at least one free physical block which is not allocated to any logical block and allocating to the logical block a free physical block belonging to a physical block group which has a smaller erasure count.

3. A method according to claim 2, further comprising the steps of locating a physical block having a smaller erasure count and allocated to a logical block belonging to a logical block group which has a smaller write count, when the free physical block is allocated, to handle as a target free physical block a free physical block belonging to the same physical block group as the physical block belongs to.

4. A method according to claim 3, further comprising the steps of copying the data in the physical block having a smaller erasure count to the free physical block belonging to the same physical block group as an old physical block allocated to the logical block having a larger write count belongs to and erasing data in the physical block from which data is copied to produce a free physical block;

newly allocating the physical block to which data is be copied to a logical block to which the physical block from which data is to be copied is allocated; and erasing data in the old physical block to produce a free physical block.

5. A method according to claim 2, wherein the step of allocating a logical block having a larger write count to a physical block having a smaller erasure count is performed each time the erasure count of a physical block corresponding to the logical block having a larger write count reaches a predetermined multiple, and comprising the step of:

allocating the physical block to a free physical block belonging to the same physical block group as the old physical block to which the logical block is allocated belongs to and erasing the data in the old physical block to produce a free physical block when data is written into a logical block other than the logical block having a larger write count.

6. A method according to claim 1, wherein the logical block group comprises a central group of a predetermined count range to which the average one of write counts of all the logical blocks belongs, and at least one side group on each of both the sides of the central group, and comprising the step of changing the groups each time data is written.

7. A method according to claim 1, wherein the physical block group comprises a central group of a predetermined count range to which the average one of erasure counts of all the physical blocks belongs, and at least one side group on each of both the sides of the central group, and comprising the step of changing the groups each time data is erased.

8. A method of controlling a memory system using a flash memory where a logical block as a unit accessed by a computer is allocated to a physical block of the flash memory, comprising the steps of:

predicting whether a write count of each logical block in the future is larger or smaller on the basis of the situation of access to that logical block;

managing an erasure count of each physical block when that physical block is erased; and allocating a logical block having a write count which is predicted to be larger to a physical block having a smaller erasure count and allocating a logical block having a write count which is predicted to be smaller to a physical block having a larger erasure count.

9. A memory system using a flash memory where logical blocks each as a unit accessed by a computer are allocated by allocation means to physical blocks of the flash memory, comprising:

a flash memory having a plurality of individually erasable physical blocks;

table means for holding the relationship in correspondence between the logical blocks allocated by the allocation means and the physical blocks;

first counting and managing means for counting and managing write counts of the respective logical blocks;

first classifying means for classifying the logical blocks into a plurality of groups on the basis of the respective write counts of the logical blocks;

erasure means for erasing data in a physical block allocated to a logical block to produce a free physical block;

second counting and managing means for counting and managing the erasure counts of the respective physical blocks;

second classifying means for classifying the physical blocks into a plurality of groups on the basis of the respective erasure counts of the physical blocks;

control means for allocating the respective logical blocks to the physical blocks; and means for managing free physical blocks which are not allocated to any logical blocks;

wherein said allocation control means performs an exchanging process as required which comprises the steps of allocating a logical block belonging to a logical block group having a larger write count to a free physical block belonging to a physical block group having a smaller erasure count and allocating a logical block belonging to a logical block group having a smaller write count to a free physical block belonging to a logical block group having a larger erasure count.

10. A memory system according to claim 9, wherein said allocation control means allocates, in a normal write process, a logical block in which data is to be written to a free physical block belonging to the same physical block group as an old physical block which is already allocated to the logical block, and changes the old physical block to a free physical one; and performs the exchanging process when a predetermined condition is satisfied.

11. A memory system according to claim 10, wherein said allocation control means copies data in the physical block allocated to the logical block having a smaller write count to a free physical block belonging to the same physical block group as the old physical block group belongs to, and changes the old physical block to a free physical block.

12. A memory system according to claim 9, wherein the logical and physical blocks are the same in size.

13. A memory system according to claim 9, wherein the block size of a logical block is a multiple of that of a physical block, and further comprising compression/expansion means for compressing the data in the logical block and expanding the compressed data, wherein one logical block is allocated to at least one physical block in dependence on the degree of its compression.

14. A memory system according to claim 9, further comprising means for composing a queue of physical blocks connected to each of logical block group units of logical blocks to which the physical blocks belonging to each of physical block groups are allocated for that physical block group, and group table means for indicating the head of the queue, wherein said allocation control means performs the exchanging process by referring to said group table means.

15. A memory system according to claim 14, wherein said group table means also manages free physical blocks belonging to each of the physical block groups for each physical block group.

16. A storage system according to claim 10, wherein the predetermined condition is that when a logical block belonging to a logical block group having a larger write count has received a write request, the erasure count of the free physical block in which data is to be written is a multiple of a predetermined number.

* * * * *

UNITED STATES PATENT AND TRADEMARK OFFICE
CERTIFICATE OF CORRECTION

PATENT NO. : 5,737,742
DATED : April 7, 1998
INVENTOR(S) : K. ACHIWA et al

It is certified that error appears in the above-indentified patent and that said Letters Patent is hereby corrected as shown below:

On the front page of the patent, first column, please add:

--(30)     Foreign Application Priority Data
  June 29, 1994   (JP)   Japan .........6-147943--.

Signed and Sealed this

Fourth Day of August, 1998

Attest:

BRUCE LEHMAN

*Attesting Officer*      *Commissioner of Patents and Trademarks*